(12) United States Patent
Maunder et al.

(10) Patent No.: US 12,088,320 B2
(45) Date of Patent: Sep. 10, 2024

(54) ELECTRONIC DEVICE FOR LOW DENSITY PARITY CHECK DECODING, AND METHOD THEREFOR

(71) Applicant: AccelerComm Limited, Southampton (GB)

(72) Inventors: Robert Maunder, Southampton (GB); Matthew Brejza, Southampton (GB); Peter Hailes, Southampton (GB)

(73) Assignee: AccelerComm Limited, Southampton (GB)

( * ) Notice: Subject to any disclaimer, the term of this patent is extended or adjusted under 35 U.S.C. 154(b) by 0 days.

(21) Appl. No.: 17/925,587

(22) PCT Filed: May 14, 2021

(86) PCT No.: PCT/EP2021/062889
§ 371 (c)(1),
(2) Date: Nov. 15, 2022

(87) PCT Pub. No.: WO2021/233789
PCT Pub. Date: Nov. 25, 2021

(65) Prior Publication Data
US 2023/0208440 A1    Jun. 29, 2023

(30) Foreign Application Priority Data

May 18, 2020   (GB) ..................................... 2007341

(51) Int. Cl.
*H03M 13/11* (2006.01)
*H03M 13/00* (2006.01)
*H04L 1/00* (2006.01)

(52) U.S. Cl.
CPC .... *H03M 13/1137* (2013.01); *H03M 13/1111* (2013.01); *H04L 1/0057* (2013.01)

(58) Field of Classification Search
CPC ........... H04L 1/0057; H03M 13/1137; H03M 13/1111; H03M 13/6561; H03M 13/6516;
(Continued)

(56) References Cited

U.S. PATENT DOCUMENTS 9,727,419 B2 *   8/2017   Wu .................... H03M 13/1171
10,797,727 B1 * 10/2020   Walke ................. H03M 13/116
(Continued)

OTHER PUBLICATIONS

Qualcomm Incorporated, "Design of multiple family LDPC codes", vol. RAN WGI, No. Athens, Greece; Feb. 13, 2017-Feb. 17, 2017, (Feb. 12, 2017), 3GPP Draft; RI_1702642_MULTIPLE_FAMILY_LDPC_CODES, 3rd Generation Partnership Project (3GPP).
(Continued)

*Primary Examiner* — Justin R Knapp
(74) *Attorney, Agent, or Firm* — Optimus Patents US, LLC

(57) ABSTRACT

An electronic device is described that is configured to perform a series of low density parity check, LDPC, decoding operations that use at least one basegraph that comprises two or more columns, each column associated with a set of two or more soft bit values. The electronic device includes two or more rotators, each rotator configured to rotate an order of a subset of two or more soft bit values of the set of two or more soft bit values of a column when activated in an LDPC decoding operation; and wherein rotations associated with each column in each basegraph are performed by a particular one of the rotators of the two or more rotators, wherein each rotator performs rotations for a set of one or more columns, with at least one of the rotators performing rotations for two or more columns in a same basegraph.

20 Claims, 18 Drawing Sheets

(58) Field of Classification Search
CPC ........... H03M 13/6393; H03M 13/616; H03M 13/114; H03M 13/1105
See application file for complete search history.

(56) References Cited

U.S. PATENT DOCUMENTS

| | | | |
|---|---|---|---|
| 10,833,704 B1* | 11/2020 | Walke | H03M 13/6519 |
| 11,615,025 B2* | 3/2023 | Musin | G06F 12/0246 |
| | | | 711/154 |
| 2004/0034828 A1 | 2/2004 | Hocevar | |
| 2015/0254130 A1 | 9/2015 | Sakaue et al. | |
| 2023/0208441 A1* | 6/2023 | Maunder | H03M 13/116 |
| | | | 714/757 |

OTHER PUBLICATIONS

Weiner Matthew et al, "27.7 A scalable I.5-to-6Gb/s 6.2-to-38. ImW LDPC decoder for 60GHz wireless networks in 28nm UTBB FDSOI", IEEE International Solid State Circuits Conference.

* cited by examiner

| BG1 row group | BG1 rows | Comment |
|---|---|---|
| A | 0 to 3 | Core rows |
| B | 4 to 19 | Non-orthogonal extension rows |
| C | 20 (C1) and 21 (C2) | A pair of orthogonal extension rows |
| D | 22 (D1) and 23 (D2) | A pair of orthogonal extension rows |
| E | 24 (E1) and 25 (E2) | A pair of orthogonal extension rows |
| ... | ... | ... |
| O | 44 (O1) and 45 (O2) | A pair of orthogonal extension rows |

FIG. 10

| BG2 row group | BG2 rows | Comment |
|---|---|---|
| A | 0 to 3 | Core rows |
| B | 4 to 10, 13 to 16 and 19 | Non-orthogonal extension rows |
| C | 11 (C1) and 12 (C2) | A pair of orthogonal extension rows |
| D | 17 (D1) and 18 (D2) | A pair of orthogonal extension rows |
| E | 20 (E1) and 21 (E2) | A pair of orthogonal extension rows |
| F | 22 (F1) and 23 (F2) | A pair of orthogonal extension rows |
| G | 24 (G1) and 25 (G2) | A pair of orthogonal extension rows |
| ... | ... | ... |
| O | 40 (O1) and 41 (O2) | A pair of orthogonal extension rows |

FIG. 11

ELECTRONIC DEVICE FOR LOW DENSITY PARITY CHECK DECODING, AND METHOD THEREFOR

FIELD OF THE INVENTION

The field of the invention relates to a Low Density Parity Check (LDPC) decoder circuit, an electronic device, and a method for computation of LDPC decoding. The field of the invention is applicable to, but not limited to, channel coding for current and future generations of communication standards.

BACKGROUND OF THE INVENTION

LDPC Coding

As shown in FIG. 1, a Low-Density Parity Check (LDPC) code may be used to protect data from errors that are imposed during unreliable transmission or storage. The data is typically represented by a vector comprising K data symbols, each of which can take a value in the range '0' to 'M−1', where M is the radix of the code. While extensive research has been conducted on the topic of non-binary LDPC codes, with M typically adopting a value in the set {4, 8, 16, . . . }, it is binary LDPC codes with M=2 that are typically adopted in practical applications. Hence, for the sake of simplicity, the remainder of this background discussion assumes that the data vector 102 comprises K bits, each of which can take a value of '0' or '1'.

The known LDPC code operates using two processes, where the first comprises LDPC encoding before unreliable transmission or storage and the second comprises LDPC decoding afterwards. The LDPC encoder 103 and decoder 104 must adopt compatible parameterisations, which may be specified by a Parity Check Matrix (PCM) having N' columns, N'−K rows and populated with binary values of '0' and '1'.

LDPC encoding uses the PCM H to convert the vector x 102 of K data bits into a vector y 105 of N' encoded bits, where N' is greater than K. This is typically achieved by setting the first K bits in the encoded bit vector (referred to as its systematic bits) equal to the K data bits of vector x 102, then setting the remaining N'−K bits (referred to as the parity bits), such that y·H=0 in the Galois Field GF(M), where '0' is a syndrome vector comprising N'−K 0-valued bits. As understood in the field, the 'Galois Field' notation means binary with the arithmetic operation+mapping to an XOR function. Hence, it can be said that the first K columns in the PCM correspond to the data bits of vector x 102, while the set of all columns correspond to the N encoded bits of vector y 105.

During unreliable storage or transmission, the vector y 105 of N' encoded bits is exposed to errors and is typically converted into a vector 106 of N' encoded soft bits, which express how likely each of the N' encoded bits of vector y 105 is to have a value of '0' or '1'. Typically, each soft bit is represented using a Logarithmic Likelihood Ratio (LLR), where:

$$LLR = \ln\frac{Pr(\text{bit}=0)}{Pr(\text{bit}=1)}.$$

Hence for the sake of simplicity, the remainder of this background discussion assumes that all soft bits are expressed using LLRs.

LDPC decoding 104 may then use the PCM to convert the vector of N' encoded LLRs 106 into a vector of K decoded bits 107. Provided that the errors introduced during transmission or storage are not too severe, the K decoded bits 107 are typically a reproduction of the K data bits of vector x 102 that were input into the encoder 103.

The 3GPP New Radio LDPC Code

Referring back to FIG. 1, illustrates a known schematic of LDPC coding and related signal processing operations in a $3^{rd}$ generation partnership project (3GPP) New Radio (NR). As shown in FIG. 1, LDPC codes are adopted to protect data from transmission errors in the 3GPP NR standard for fifth generation (5G) mobile communications [1]. In this application, the K data bits of 102 are formed as a concatenation of three separate bit vectors, where the first vector comprises K'−L information bits 108, the second vector comprises L bits introduced by a Cyclic Redundancy Check (CRC) encoder 109 and the third vector comprises K−K' bits introduced by filler bit insertion 110. Following LDPC encoding 103, rate-matching 111 is used to convert the resultant vector of N' encoded bits 105 into a vector of $E_r$ rate-matched bits 112. Following unreliable transmission, derate-matching 113 is used to convert the vector of $E_r$ rate-matched LLRs 114 into the vector of N' encoded LLRs 106, which are input into the LDPC decoder 104. Here, the N' encoded LLRs 106 may also include contributions from LLRs received during previous transmissions in a Hybrid Automatic Repeat Request (HARQ) process and stored using a HARQ buffer 115. Following LDPC decoding, filler bit removal 116 may be used to remove the K−K' filler bits from the vector of K decoded bits 107. Then a CRC decoder 117 may be used to check the CRC within the resultant vector of K' decoded bits 118, in order to determine if any uncorrected transmission errors remain. If not, then the CRC decoder can remove the L CRC bits and output the K'−L decoded information bits 119. Either way, the CRC decoder can also output a binary flag 120, to indicate whether or not the CRC check was successful.

The 3GPP New Radio LDPC code is specified by PCMs that are derived from two basegraphs, called BG1 200 and BG2 300, FIGS. 2 and 3 illustrate known representations of BG1 200 and BG2 300 from 3GPP New Radio, respectively. Each basegraph comprises a matrix populated with binary values of '0' and '1'. BG1 200 has $n_1 = n_{c,1} + n_{e,1} = 68$ columns, which are split into $n_{c,1} = 26$ core columns 201 on the left and $n_{e,1} = 42$ extension columns 202 on the right. BG1 200 has $m_1 = m_{c,1} + n_{e,1} = 46$ rows, which are split into $m_{c,1} = 4$ core rows 203 at the top and $m_{e,1} = n_{e,1} = 42$ extension rows 204 at the bottom. Meanwhile, BG2 300 has $n_2 = n_{c,2} + n_{e,2} = 52$ columns, which are split into $n_{c,2} = 14$ core columns 301 on the left and $n_{e,2} = 38$ extension columns 302 on the right. BG2 300 has $m_2 = m_{c,2} + n_{e,2} = 42$ rows, which are split into $m_{c,2} = 4$ core rows 303 at the top and $m_{e,2} = n_{e,2} = 38$ extension rows 304 at the bottom.

In both basegraphs, the submatrix formed by the intersection of the core columns 201 and 301, and core rows 203 and 303, is densely populated with binary values of '1'. Indeed, 19 out of the $n_{c,1} = 26$ core columns 201 have the binary value of '1' in each of the core rows 203 in BG1 200. Meanwhile, up to 10 out of the $n_{c,2} = 14$ core columns 301 in FIG. 3 have the binary value of '1' in each of the core rows 303 in BG2 300. The submatrix formed by the intersection of the core columns 201 and 301 and the extension rows 204 and 304 is sparsely populated with binary values of '1', except for the first two columns that are referred to as the punctured core columns and which are densely populated with binary values of '1'. Indeed, no more than 9 out of the $n_{c,1}=26$ core columns 201 have the binary value of '1' in any of the extension rows 204 in BG1 200. Meanwhile, no more than out of the $n_{c,2}=14$ core columns 301 have the binary value of '1' in any of the extension rows 304 in BG2 300.

The submatrix formed by the intersection of the extension columns 202 and 302 and the core rows 203 and 303 is completed filled with binary values of 0 in both basegraphs 200 and 300. The square submatrix formed by the intersection of the extension columns 202 and 302 and the extension rows 204 and 304 is mostly filled with binary values of '0', except for the elements that sit on the diagonal that runs from the top left corner of the submatrix to the bottom right corner, which adopt a binary value of '1' in both basegraphs 200 and 300. Note that, in both basegraphs, some extension rows 204 and 304 are orthogonal to one or both of their neighbouring extension rows. Here, two rows (or two columns) can be considered to be orthogonal to each other if their logical AND is a vector comprising only binary values of '0'.

Note that depending on the operation of the rate-matching, some of the extension columns 202 and 302 and the corresponding extension rows 204 and 304 may be deleted from the basegraph at run-time, before it is used to generate the PCM. Here, the extension row 204 and 304 that corresponds to a particular extension column 202 and 302 is the one that it shares a binary value of 1 with. This deletion reduces the number of extension columns 202 and rows 204 in BG1 200 from $n_{e,1}$ to $n'_{e,1}$ and reduces the number of extension columns 302 and rows 304 in BG2 300 from $n_{e,2}$ to $n'_{e,2}$. Hence the number of columns becomes $n'_1=n_{c,1}+n'_{e,1}$ and $n'_2=n_{c,2}+n'_{e,2}$, for BG1 200 and BG2 300 respectively, while the number of rows becomes $m'_1=m_{c,1}+n'_{e,1}$ and $m'_2=m_{c,2}+n'_{e,2}$, for BG1 200 and BG2 300 respectively.

The PCM used at run-time for a particular LDPC encoding and decoding process is obtained by selecting one or other of the basegraphs and lifting it using a lifting factor Z, for which 51 values of up to $Z_{max}=384$ are supported in 3GPP New Radio. Here, each binary element in the basegraph 200 and 300 is replaced by a submatrix having dimensions of Z×Z. Hence, each row or column in the basegraph 200 and 300 corresponds to a set of Z rows (referred to as a blockrow) or a set of Z columns (referred to as a blockcolumn) in the PCM. Furthermore, a PCM derived from BG1 200 comprises $N'=n'_1Z$ columns and $N'-K=m'_1Z$ rows, while a PCM derived from BG2 300 comprises $N'=n'_2Z$ columns and $N'-K=m'_2Z$ rows. In the case of BG1 200, K=22Z and the first 22 blockcolumns correspond to the data bits x 102. Meanwhile, K=10Z in the case of BG2 300, where the first 10 blockcolumns correspond to the data bits 102. In 3GPP New Radio, the values of K and Z are selected according to a set of rules, dependent on the value of K'.

Binary elements in the basegraph having the value '0' are replaced by a Z×Z submatrix filled with binary values of '0'. By contrast, binary elements in the basegraph having the value '1' are replaced by a submatrix in which Z elements adopt a binary value of '1' and the remaining Z×(Z−1) elements adopt a binary value of '0'. In the extension blockcolumns, these Z1-valued binary elements are positioned on the diagonal that runs from the top left corner of the Z×Z submatrix 401 to the bottom right corner. By contrast, in the core blockcolumns, these Z1-valued binary elements are positioned according to a circular rotation 402 of this diagonal, as illustrated in FIG. 4. More specifically, FIG. 4 illustrates a known matrix interpretation of various example rotations applied with exampling lifting factors Z, in order to convert between natural and rotated orderings of variables. The diagonal used for each 1-valued binary element in the core blockcolumns is rotated by a different number of positions in the range '0' to 'Z−1', dependent on the particular basegraph and value of Z selected at run-time.

A Conventional LDPC Decoder Implementation

While many LDPC decoder implementations have been proposed previously, this background discussion focuses on a row-parallel layered belief propagation implementation [2], as illustrated in FIG. 5. FIG. 5 illustrates a known row-parallel layered belief propagation implementation of an LDPC decoder, with application for the 3GPP New Radio LDPC code. In general, this type of implementation can be designed to support any number of basegraphs at run-time, having any dimensions and sets of supported lifting factors Z. However, for the sake of simplicity, this background discussion considers an implementation that is specifically designed to offer run-time support for both 3GPP New Radio basegraphs and all corresponding lifting factors Z. The implementation of [2] 500 comprises $n_{c,max}=\max(n_{c,1},n_{c,2})$ core Variable Node (VN) memories, one extension VN memory 502, $n_{c,max}$ rotators 505 and one Check Node (CN) processor, which are all operated under the control of a controller 506. Each of the $n_{c,max}$ core VN memories 503 is connected to an Input-Output (I-O) port 504 of the CN processor 501 via a corresponding one of the $n_{c,max}$ rotators 505. Meanwhile, the extension VN memory 502 is connected directly to an I-O port 504 of the CN processor 501. Hence, the CN processor 501 is connected to a total of $n_{c,max}+1$ VN memories 502 and 503, either via a corresponding rotator 505 or directly. The VN memories 502 and 503, rotators 505 and CN processor 501 may be designed to adopt a parallelism of P, such that each connection can transfer P number of LLRs at a time. Thus, different memory configurations are known.

Each of the $n_{c,1}$ or $n_{c,2}$ core blockcolumns in the PCM is mapped to a different one of the core VN memories 503 and the set of the $n'_{e,1}$ or $n'_{e,2}$ extension blockcolumns is mapped to the extension VN memory 502. Here, the extension VN memory 502 comprises $n'_{e,1}$ or $n'_{e,2}$ sub-memories, each of which is mapped to a different one of the extension blockcolumns. Note that since there is only a single binary value of '1' in each extension blockcolumn 202 and 302 respectively of the basegraph of FIG. 2 and FIG. 3. The inventors of the present invention have recognised and appreciated that each sub-memory in the extension VN memory 502 is equivalently mapped to the one of the $m'_{e,1}$ or $m'_{e,2}$ extension blockrows that corresponds to the row of the basegraph that accommodates this binary value of '1'. The LDPC decoding process is initialised by loading each successive set of Z LLRs from the vector of N' encoded LLRs 106 into the VN memory or sub-memory that corresponds to each successive blockcolumn in the PCM. Note that the LLRs loaded into the core VN memories 503 corresponding to the first two blockcolumns (which are referred to as the punctured blockcolumns) typically adopt values of 0 in the 3GPP New Radio LDPC code. Meanwhile, the LLRs that correspond to the K-K' filler bits typically adopt large positive LLR values.

The conventional LDPC decoder implementation performs an LDPC decoding process using a number of iterations, where each iteration completes one pass of processing over the PCM. Each iteration is comprised of processing performed for each blockrow of the PCM, where the order in which the blockrows are processed within each iteration is dictated by a layered belief propagation schedule. The processing of each blockrow of the PCM is comprised of a number of LDPC decoding operations, where each operation performs processing for a set of P rows within the blockrow and where the processing of one LDPC decoding operation is depicted in the flowchart 600 of FIG. 6. Here, FIG. 6 illustrates a known flow chart for the operation of a LDPC decoding process for a row-parallel layered belief propagation implementation. Each LDPC decoding operation comprises a first sub-step and a second sub-step, as shown in FIG. 6. A number of processes are performed during each sub-step and these may be spread over a number of consecutive clock cycles.

More specifically, the LDPC decoding process is completed over a number of operations, as illustrated in the flowchart 600 of FIG. 6. Each operation of the flowchart 600 processes LLRs associated with P rows within the same blockrow of the PCM, where these rows are typically consecutive. Typically, the complete set of rows within a blockrow are processed during a group of ceil(Z/P) consecutive operations, with each successive operation of the flowchart 600 typically processing successive sets of P rows in order. Thus, different LLR configurations are known.

Furthermore, the blockrows are typically processed in an order dictated by a schedule, which may repeat the processing of some or all of the blockrows over numerous iterations. During each operation of the flowchart 600 of the LDPC decoding process shown in FIG. 6, binary values of '1' in the core columns 201 and 301 of the corresponding row of the basegraph are used to activate the associated rotators 505, core VN memories 503 and CN processor I-O ports 504 of FIG. 5.

As shown in FIG. 6, each operation of the flowchart 600 commences at 605 followed by completing two sub-steps at 601 and 602, before concluding at 627. The first sub-step 601 comprises rotator activation at 608, VN memory reading at 606 and 610, rotation at 611, CN processor inputting at 612 and CN processor calculation at 615. The second sub-step 602 comprises rotator activation at 617, CN processor further calculation at 619, CN processor outputting at 620, rotation at 621, VN memory writing at 622 and 625, and syndrome calculation at 627.

During the first sub-step 601 of each operation the LDPC decoding process, each of the activated core VN memories (say core VN memories 503 in FIG. 5) are read under the direction of the controller (say controller 506 in FIG. 5), in order to provide the P LLRs that are required to complete the processing of the P rows of the PCM. Furthermore, each of the activated rotators (say activated rotators 505 in FIG. 5) is configured to rotate these P LLRs into the order required to complete this processing, which is performed under the direction of the controller and according to the rotations used to convert the basegraph 200 and 300 into the PCM. Each activated rotator provides the corresponding set of P LLRs to the input of the corresponding I-O port (say I-O port 504 of the CN processor 501 in FIG. 5).

Furthermore, during the first sub-step 601 in each operation of the LDPC decoding process that corresponds to an extension row 204 and 304 in the basegraph, the CN processor 501 is also provided with a set of P LLRs that are read from the extension VN memory (say extension VN memory 502 in FIG. 5). More specifically, these LLRs are provided by the particular sub-memory in the extension VN memory that is mapped to that extension row 204 and 304. By contrast, the extension VN memory is deactivated during the first sub-step 601 of each operation of the LDPC decoding process that corresponds to a core row 203 and 303 in the basegraph, with the result that it does not provide any LLRs to the CN processor.

In the manner described above, the activated subset of the connections to the inputs of the I-O ports of the CN processor each provide it with a set of P LLRs in the first sub-step 601 of each operation of the LDPC decoding process. In response to this, the CN processor performs P sets of calculations in parallel, for the P associated rows of the PCM. This may be achieved using a variety of algorithms [3], including the sum-product, min-sum, normalised min-sum, offset min-sum or adjusted min-sum, for example. The CN processor typically employs internal memory to assist these calculations using results obtained during the previous iteration of processing the P associated rows of the PCM. These results are typically overwritten with new results, which can be used to assist the next iteration of processing the P associated rows of the PCM. In the second sub-step 602 in each operation of the LDPC decoding process, and following the completion of all calculations performed by the CN processor, it may use outputs from its I-O ports to provide a set of P LLRs to each of its connections that are activated in the current operation of the flowchart 600 of the LDPC decoding process.

For example, in the first sub-step 601 of an LDPC decoding process performed for a set of P rows in the PCM, the CN processor may combine P LLRs provided by inputs to each of its A activated I-O ports using the min-sum algorithm. Here, we may represent the input LLRs using the notation $a_{i,p}$ where i is in the range 1 to A and indicates which of the A activated I-O ports the LLR is provided on and p is in the range 1 to P and indicates which of the P LLRs provided on that I-O port this LLR is. In a first calculation, the CN processor may perform a calculation $b_{i,p}=a_{i,p}-m_{i,p}$ corresponding to each input LLR $a_{i,p}$, where $m_{i,p}$ is a corresponding internally stored value, which is initialised to '0' at the start of the LDPC decoding process and which is updated in each iteration of the processing of the P rows in the PCM. Following this, the first and second minimum of the absolute values $|b_{i,p}|$ is identified for each value of p and the corresponding values of the index i are referred to as min1 and min2, respectively. Furthermore, the product of the signs $\text{sign}(b_{i,p})$ is identified for each value of p and referred to as $\text{sign}_p$, where sign(x) is '+1', if x is not less than '0', and '−1' otherwise.

In the second sub-step 602, the CN processor may perform a calculation $m_{min1,p}=\text{sign}(b_{i,p})\times\text{sign}_p\times|b_{min2,p}|$ corresponding to the input LLR $a_{i,p}$ having the index i that equals min1 for each value of p. Meanwhile, a calculation $m_{i,p}=\text{sign}(b_{i,p})\times\text{sign}_p\times|b_{min1,p}|$ is performed corresponding to all other input LLRs for each value of p. Here, the value of $m_{i,p}$ is written into the internally stored value for each combination of i and p, so that it can be used during the next iteration of the processing of the P rows, as described above. Finally, the CN processor may perform a calculation $d_{i,p}=b_{i,p}+m_{i,p}$, in order to obtain an output LLR $d_{i,p}$ for each of the P LLRs provided as outputs on each of the A activated I-O ports, in correspondence with the input LLR $a_{i,p}$.

Following this, the second sub-step 602, in each operation of the LDPC decoding process, proceeds with each of the activated rotators being configured to rotate the set of P LLRs that it is provided with, into an order that is appropriate for storage in the corresponding activated core VN memory. Furthermore, during the second sub-step 602 in each operation of the LDPC decoding process, the CN processor may also calculate syndrome bits corresponding to the P associated rows of the PCM. Additionally, during the second sub-step 602 in each operation of the LDPC decoding process that corresponds to an extension row (for example 204 and 304 in the basegraphs of FIG. 2 and FIG. 3), the set of P LLRs that the CN processor provides to the extension VN memory may be written to the one of its sub-memories that is mapped to that extension row.

Following the completion of the decoding iterations within the LDPC decoding process, a vector of N' decoded LLRs may be obtained by concatenating the sets of Z LLRs that were most recently stored in the VN memories 502 and 503. The vector of K decoded bits 107 may then be obtained with consideration of the signs of the first K decoded LLRs, where positive LLRs may be converted into the binary values of '0', while negative LLRs may be converted into binary values of '1'.

When applied to the 3GPP New Radio LDPC code, the inventors of the present invention have recognised and appreciated that a conventional LDPC decoder implementation 500 described above has a first problem, namely a large hardware requirement. This may be attributed to the requirement for $n_{c,max}=26$ rotators 505, $n_{c,max}=26$ core VN memories 503 and a CN processor 501 having $n_{c,max}+1=27$ I-O ports 504. The maximum number of these rotators 505, core VN memories 503 and I-O ports 504 that are activated in any single operation 600 of an LDPC decoding process is 19, which only occurs when processing the core rows 203 of BG1 200. When processing the extension rows 204 of BG1 200, the maximum number of rotators 505 and core VN memories 503 that are activated at a time is 9 and the maximum number of CN processor I-O ports 504 that are activated is 10 (including the I-O port 504 connected to the extension VN memory 502). In the case of BG2 300, there are only 14 core columns 301 and so there are 12 out of the 26 rotators 505, 12 out of the 26 core VN memories 503 and 12 out of the 27 I-O ports 504 of the CN processor 501 that are never activated during the processing of BG2 300. Furthermore, the maximum number of rotators 505, core VN memories 503 and CN processor I-O ports 504 that are activated at a time during the processing of BG2 300 is 10, which occurs during the processing of some core rows 303.

Furthermore, when applied to the 3GPP New Radio LDPC code, the inventors of the present invention have recognised and appreciated that a conventional LDPC decoder implementation 500 described above has a second problem, namely the requirement to complete a large number of decoding operations, leading to a poor throughput and latency. This may be attributed to the requirement to complete one decoding operation for each set of P rows in the PCM, which is high when the PCM comprises a high number of rows. Many of these operations perform relatively little processing because some of the rows in the basegraphs have as few as 4 or 5 binary values of 1 in the core columns (201 and 301). Hence, many of the rotators 505, core VN memories 703 and CN processor I-O ports 704 are disabled when processing these rows, representing wastage.

SUMMARY OF THE INVENTION

The present invention provides LDPC decoders and methods for LDPC decoding using parallel processing, for example with reduced hardware requirement and/or reduced number of processing operations. In particular, examples of the present invention details efficient mappings between hardware components and algorithmic features. Specific example embodiments of the invention are set forth in the dependent claims. These and other aspects of the invention will be apparent from, and elucidated with reference to, the example embodiments described hereinafter.

In a first aspect of the invention, an electronic device is configured to perform a series of low density parity check, LDPC, decoding operations that use at least one basegraph that comprises two or more columns, each column associated with a set of two or more soft bit values, the electronic device comprising: two or more rotators, each rotator configured to rotate an order of a subset of two or more soft bit values of the set of two or more soft bit values of a column when activated in an LDPC decoding operation; and wherein rotations associated with each column in each basegraph are performed by a particular one of the rotators of the two or more rotators, wherein each rotator performs rotations for a set of one or more columns, with at least one of the rotators performing rotations for two or more columns in a same basegraph. In this manner, the number of rotators can be reduced, leading to a hardware resource requirement reduction.

In an optional example, the electronic device may further comprise a controller, operably coupled to the two or more rotators, and configured to independently control an activation and a rotation of each of the two or more rotators based on a current LDPC decoding operation and the at least one basegraph. In this manner, the control of the rotators can be centralised, leading to an increased efficiency in terms of hardware resource requirement.

In an optional example, the electronic device may be configured to perform the LDPC decoding operations that comprise sub-steps for a parity check matrix, PCM, of the at least one basegraph, further comprising: a check node, CN, processor operably coupled to the controller and having a plurality of input-output, I-O, ports, wherein the controller may be configured to activate a subset of the a plurality of I-O ports in each LDPC decoding operation, wherein the CN processor is configured to perform LDPC decoding computations for two or more rows of the PCM derived from a single row in the at least one basegraph; and wherein each rotator is operably coupled to a corresponding I-O port of the CN processor and wherein a corresponding rotated subset of two or more soft bit values are passed between each activated rotator and its corresponding I-O port of the CN processor in each LDPC decoding sub-step. In this manner, the number of I-O ports of the CN processor is reduced in accordance with the reduction in the number of rotators, leading to a simpler CN processor having a reduced hardware resource requirement.

In an optional example, the electronic device may further comprise: two or more VN memories, each VN memory configured to store sets of two or more soft bit values of the two or more columns, wherein the two or more VN memories are operably coupled to the controller that is configured to activate a read operation from and a write operation to a subset of the two or more VN memories in the current LDPC decoding operation; and wherein each rotator and the set of columns for which it performs rotations is operably coupled to a corresponding VN memory of the two or more VN memories and wherein the subset of two or more soft bit values are passed between each activated rotator and its corresponding VN memory in each LDPC decoding operation. In this manner, the number of VN memories is reduced in accordance with the reduction in the number of rotators, leading to a reduced hardware resource requirement.

In an optional example of the electronic device, sub-steps in each LDPC decoding operation may be grouped into a first set and a second set, and wherein in each sub-step, the controller may be configured to activate a subset of the two or more rotators corresponding to a subset of the two or more columns that have a binary value of '1' in a row of the at least one basegraph. In this manner, all columns that have a binary value of '1' in a row of the at least one basegraph can be processed by the rotators over the course of one or more sub-steps.

In an optional example of the electronic device, in each sub-step of the first set of sub-steps of LDPC decoding operations, the VN memory corresponding to each activated rotator may be configured to provide the corresponding activated rotator with two or more soft bit values, which are read from a location in the VN memory corresponding to a column having a binary value of '1' in the row of the at least one basegraph. In this manner, all soft bits corresponding to columns that have a binary value of '1' in a row of the at least one basegraph can be processed by the rotators over the course of one or more sub-steps.

In an optional example of the electronic device, in each sub-step of the second set of sub-steps in the LDPC decoding operations, the CN processor may be configured to provide a corresponding subset of two or more updated soft bit values to each activated rotator using the corresponding I-O port; and each activated rotator provides its corresponding VN memory with the two or more updated soft bit values, which are written to a location in the VN memory corresponding to a column having a binary value of '1' in the row of the at least one basegraph. In this manner, all soft bits corresponding to columns that have a binary value of '1' in a row of the at least one basegraph can be updated by the rotators over the course of one or more sub-steps.

In an optional example of the electronic device, during the first set of the LDPC decoding operations, an extension VN memory may be configured to provide two or more soft bit values to an I-O port of the CN processor when the row in the at least one basegraph is an extension row. In this manner, the LDPC decoding operation can benefit from soft-bits corresponding to extension columns.

In an optional example of the electronic device, the CN processor may be configured to determine two or more minimum values and two or more next minimum values from the two or more soft bit values provided as inputs on each of its I-O ports in each of the sub-steps during the first set of sub-steps of the LDPC decoding operations and wherein the CN processor may be configured to use the two or more minimum values and two or more next minimum values to determine the two or more soft bit values provided as outputs on each of its I-O ports in each of the second sub-steps during the second set of sub-steps of the LDPC decoding operations. In this manner, the electronic device can execute LDPC decoding algorithms including the min-sum, the normalised min-sum, the offset min-sum and the adjusted min-sum, over the course of one or more sub-steps.

In an optional example of the electronic device, the CN processor may be configured to perform, during the second set of sub-steps of the LDPC decoding operations, at least one of: provide two or more soft bit values to an extension VN memory using one of its I-O ports when the row in the at least one basegraph is an extension row; calculate a set of two or more syndrome bits. In this manner, the electronic device can provide soft bit outputs corresponding to the extension columns in order to enable turbo-equalisation, for example. Furthermore, the syndrome bits may be exploited to perform early termination, for example.

In an optional example of the electronic device, rows of the at least one basegraph having a number of core columns that is no greater than a number of rotators may be processed using the first set comprising one first sub-step and the second set comprising one second sub-step. In this manner, the number of sub-steps required to execute the LDPC decoding operations is reduced.

In an optional example of the electronic device, rows of the at least one basegraph having a number of core columns that is greater than a number of rotators but having a number of binary values of '1' in the core columns that is no greater than a number of rotators may be processed using the first set comprising one sub-step and the second set comprising one sub-step. In this manner, the number of sub-steps required to execute the LDPC decoding operations is reduced.

In an optional example of the electronic device core rows of a first basegraph of the at least one basegraph may be processed using two sub-steps in the first set and two sub-steps in the second set of sub-steps of the LDPC decoding operations, and extension rows of the first basegraph are processed using one first sub-step in the first set and one second sub-step in the second set, and all rows of a second basegraph are processed using one first sub-step in the first set and one second sub-step in the second set. In this manner, the number of sub-steps required to execute the LDPC decoding operations is reduced.

In an optional example of the electronic device, the number of rotators may be fourteen, a number of core VN memories is fourteen and a number of CN processor I-O ports is fifteen. In this manner, LDPC decoding operations for the 3GPP LDPC code can be executed using a reduced hardware resource requirement.

In an optional example of the electronic device, the CN processor may be configured to perform at least one of: processing of each sub-step spread over one or more clock cycles; processing of successive sub-steps in a same pipelined set; processing of the first set and the second set in a same pipelined set of LDPC decoding operations; processing of successive pipelined LDPC decoding operations in a same row of the at least one basegraph; processing of successive orthogonal pipelined rows in the at least one basegraph. In this manner, the number of clock cycles required to execute the LDPC decoding operations is reduced.

In an optional example of the electronic device, the at least one basegraph includes a plurality of rows, the electronic device comprising: a check node, CN, processor comprising two or more CN sub-processors, each CN sub-processor having one or more input/output (I-O) ports; a controller, operably coupled to the CN processor and configured to activate a subset of the one or more I-O ports based on a current LDPC decoding sub-step of the LDPC decoding operations and the at least one basegraph; and wherein the CN processor is configured to support at least two modes of operation: a first mode of operation whereby each CN sub-processor is configured in a single LDPC decoding operation to perform LDPC decoding computations for two or more rows of the PCM that are derived from different orthogonal rows of the plurality of rows in the at least one basegraph; a second mode of operation whereby two or more of the CN sub-processors are configured in a single LDPC decoding operation to co-operate to perform LDPC decoding computations for two or more rows of the PCM that are derived from a single row in the at least one basegraph. In this manner, the number of LDPC decoding operations required to execute the LDPC decoding process may be reduced.

In an optional example of the electronic device, in the first mode of operation, the controller may be configured to allocate each row in each set of orthogonal rows in the at least one basegraph to a respective CN sub-processor. In this manner, a single LDPC decoding operation can process more than one row of a basegraph concurrently, reducing the number of LDPC decoding operations required.

In an optional example, the electronic device may further comprise: two or more rotators, operably coupled to the controller that is configured to independently control an activation and a rotation of each rotator and configured to rotate an order of two or more soft bit values when activated in an LDPC decoding sub-step; and an interconnection network, operably coupled to the controller and the CN processor and configured to support a connection of I-O ports of the CN sub-processors to incomplete subsets of the two or more rotators; wherein rotations of two or more soft bit values associated with each column in each basegraph are performed by a particular one of the two or more rotators and wherein the controller configures the interconnection network to pass the two or more soft bit values between each activated rotator and a corresponding I-O port of a CN sub-processor in each LDPC decoding sub-step. In this manner, the hardware resource requirement of the interconnection network is reduced relative to that required for a fully-connected interconnection network.

In an optional example, the electronic device may further comprise: two or more VN memories, each VN memory configured to store two or more soft bit values, wherein the two or more VN memories are operably coupled to the controller that is configured to activate a read operation from and a write operation to a subset of the two or more VN memories in the current LDPC decoding sub-step; and wherein each rotator and a corresponding set of columns may be operably coupled to a corresponding VN memory of the two or more VN memories and wherein two or more soft bit values are passed between each activated rotator and its corresponding VN memory in each LDPC decoding sub-step. In this manner, the complete set of soft-bits associated with core columns can be processed by the electronic device using a reduced number of LDPC decoding operations.

In an optional example of the electronic device, sub-steps in each LDPC decoding operation may be grouped into a first set and a second set, and wherein: in each sub-step, the controller is configured to activate a subset of the two or more rotators corresponding to a subset of the two or more columns that have a binary value of '1' in the row(s) of the at least one basegraph; and activate connections within the interconnection network to connect the activated rotators to corresponding I-O ports of the CN sub-processors. In this manner, all columns that have a binary value of '1' in a row of the at least one basegraph can be processed by the rotators and CN sub-processors over the course of one or more sub-steps.

In an optional example of the electronic device, in each sub-step of the first set of sub-steps of the LDPC decoding operations, the VN memory corresponding to each activated rotator may be configured to provide the corresponding activated rotator with two or more soft bit values, which are read from a location in the VN memory corresponding to a column having the binary value of '1' in the rows of the selected at least one basegraph. In this manner, all soft bits corresponding to columns that have a binary value of '1' in a row of the at least one basegraph can be processed by the rotators over the course of one or more sub-steps.

In an optional example of the electronic device, in each sub-step in the second set of sub-steps of the LDPC decoding operations, each activated rotator may provide its corresponding VN memory with two or more updated soft bit values, which are written to a location in the VN memory corresponding to a column having a binary value of '1' in the row(s) of the at least one basegraph. In this manner, all soft bits corresponding to columns that have a binary value of '1' in a row of the at least one basegraph can be updated by the rotators over the course of one or more sub-steps.

In an optional example of the electronic device, in the first set of the LDPC decoding operations, an extension VN memory may be configured to provide two or more soft bit values to an I-O port of a CN sub-processor for each of the rows that are extension rows in the at least one basegraph. In this manner, the LDPC decoding operation can benefit from soft-bits corresponding to extension columns.

In an optional example of the electronic device, each activated CN sub-processor may be configured to determine two or more minimum values and two or more next minimum values from the two or more soft bit values provided as inputs on each of its I-O ports in each of the sub-steps during the first set of sub-steps of the LDPC decoding operations and wherein the CN processor supports at least the following two modes of operation: in the first mode of operation, each activated CN sub-processor may be configured to use its two or more minimum values and two or more next minimum values to determine the two or more soft bit values to output on an I-O port in each of the sub-steps during the second set; in the second mode of operation, each activated CN sub-processor may be configured to use its two or more minimum values and two or more next minimum values and two or more minimum values and two or more next minimum values provided by at least one other activated CN sub-processor to determine the two or more soft bit values to output on each of I-O port in each of the sub-steps during the second set. In this manner, a common hardware resource for CN processing can be reused for both modes of operation, reducing the associated hardware resource requirement.

In an optional example of the electronic device, during the second set, an activated CN sub-processor may be configured to perform at least one of: output two or more soft bit values to an extension VN memory using an I-O ports when the corresponding row in the at least one basegraph is an extension row; calculate a set of two or more syndrome bits. In this manner, the electronic device can provide soft bit outputs corresponding to the extension columns in order to enable turbo-equalisation, for example. Furthermore, the syndrome bits may be exploited to perform early termination, for example.

In an optional example of the electronic device, the CN processor may comprise two CN sub-processors and wherein the interconnection network supports the connection of each I-O port of the CN sub-processors to two rotators. In this manner, LDPC decoding operations for the 3GPP LDPC code can be executed using a reduced hardware resource requirement.

In an optional example of the electronic device, each CN sub-processor may have seven I-O ports connected via the interconnection network to the two or more rotators. In this manner, LDPC decoding operations for the 3GPP LDPC code can be executed using a reduced hardware resource requirement.

In an optional example of the electronic device, the interconnection network connects each of its connected CN sub-processor I-O ports to a primary one of the two or more rotators whenever operating in the second mode of operation. In this manner, LDPC decoding operations for the 3GPP LDPC code can be executed using a reduced hardware resource requirement.

In an optional example of the electronic device, the CN processor may be configured to perform at least one of: processing of each sub-step spread over one or more clock cycles; processing of successive sub-steps in a same pipelined set of sub-steps; processing of the first set and the second set in a same pipelined set of LDPC decoding operations; processing of successive pipelined set of LDPC decoding operations in a same row of the at least one basegraph. In this manner, the number of clock cycles required to execute the LDPC decoding operations is reduced.

In a second aspect of the invention, a method for LDPC decoding in an electronic device comprises: performing a series of low density parity check, LDPC, decoding operations that use at least one basegraph that comprises two or more columns, each column associated with a set of two or more soft bit values; rotating an order of a subset of two or more soft bit values of the set of two or more soft bit values of a column when activated in an LDPC decoding operation, wherein rotations associated with each column in each basegraph are performed by a particular one of the rotators of the two or more rotators, wherein each rotator performs rotations for a set of one or more columns, with at least one of the rotators performing rotations for two or more columns in a same basegraph.

BRIEF DESCRIPTION OF THE DRAWINGS

Further details, aspects and embodiments of the invention will be described, by way of example only, with reference to the drawings. In the drawings, like reference numbers are used to identify like or functionally similar elements. Elements in the FIG's are illustrated for simplicity and clarity and have not necessarily been drawn to scale.

FIG. 10 illustrates a grouping of rows in BG1 from the 3GPP New Radio LDPC code, for an example embodiment of the LDPC decoder according to some examples of the invention having a reduced hardware requirement and reduced number of LDPC decoding operations.

FIG. 11 illustrates a grouping of rows in BG2 from the 3GPP New Radio LDPC code, for an example embodiment of the LDPC decoder according to some examples of the invention having a reduced hardware requirement and reduced number of LDPC decoding operations.

DETAILED DESCRIPTION

An Enhanced and Generalized LDPC Decoder Implementation

Figure 1:
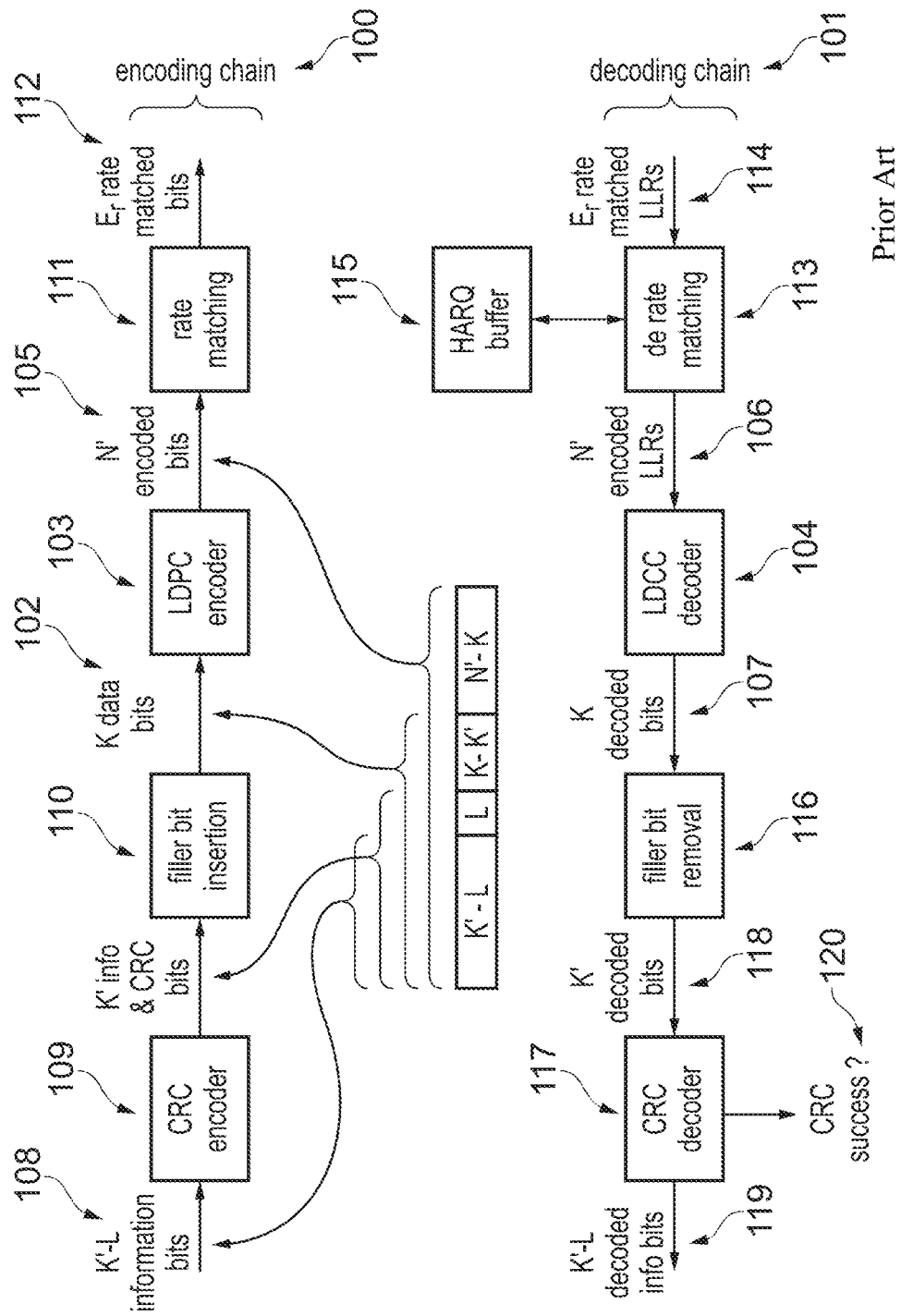
FIG. 1 illustrates a known schematic of LDPC coding and related signal processing operations in 3GPP New Radio.
Figure 2:
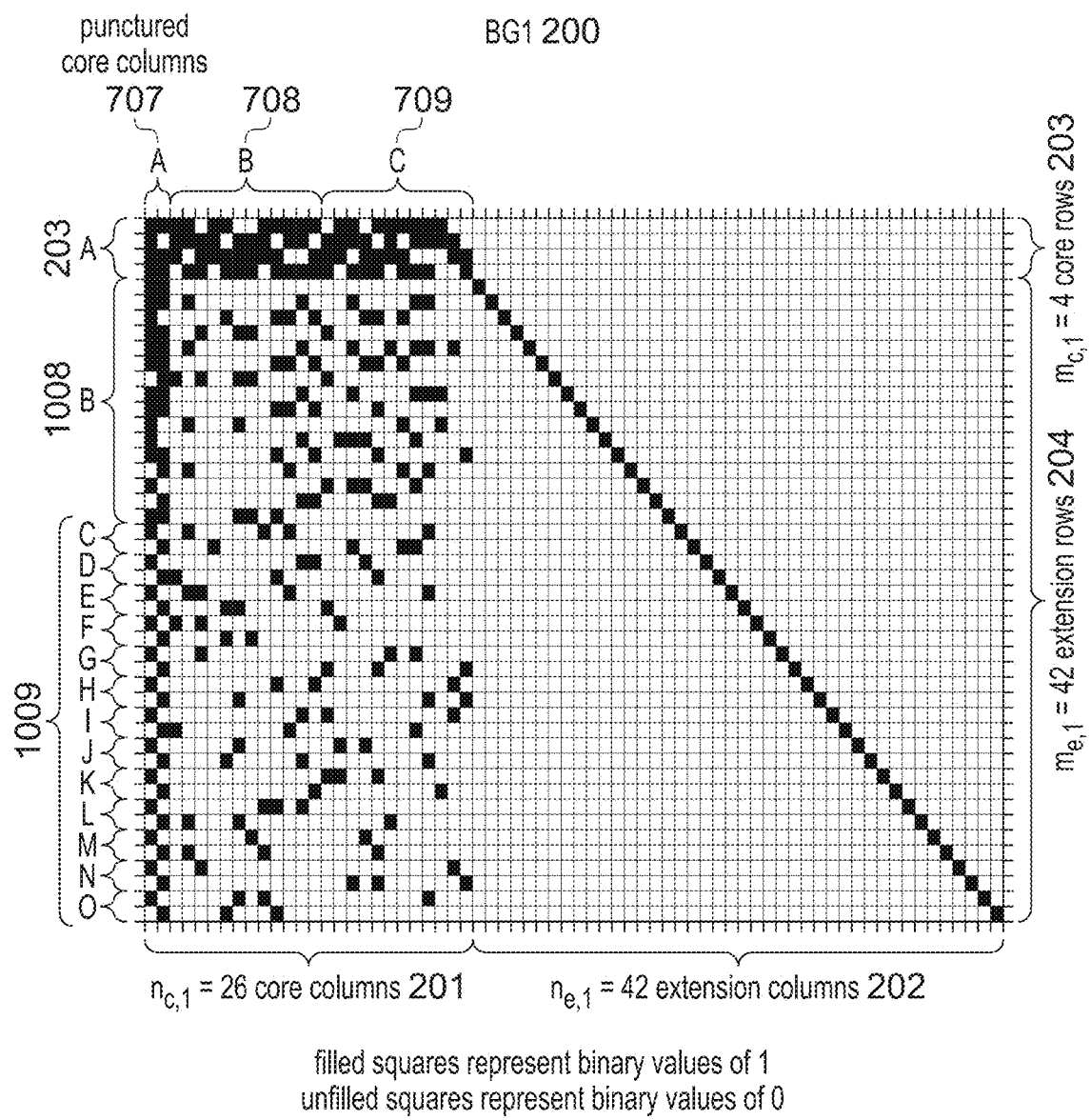
FIG. 2 illustrates a known representation of BG1 from 3GPP New Radio.
Figure 3:
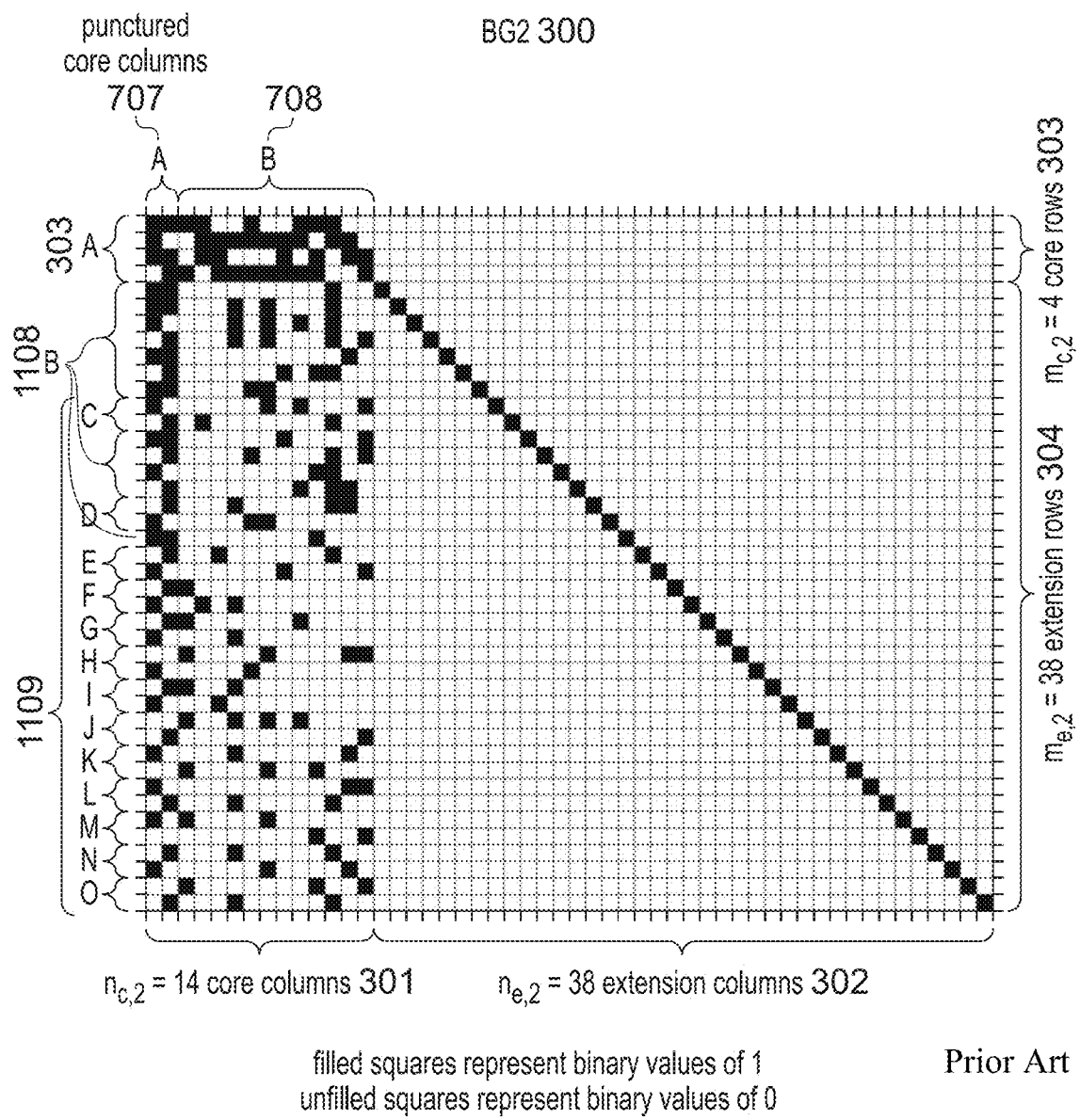
FIG. 3 illustrates a known representation of BG2 from 3GPP New Radio.

In some examples of the invention, the inventors have proposed a Low-Density Parity Check (LDPC) code that may be used to protect data from errors that are imposed during unreliable transmission or storage. The data is typically represented by a vector comprising K data symbols, each of which can take a value in the range '0' to 'M−1', where M is the radix of the code. While extensive research has been conducted on the topic of non-binary LDPC codes, with M typically adopting a value in the set {4, 8, 16, . . . }, it is binary LDPC codes with M=2 that are typically adopted in practical applications. Hence, for the sake of simplicity, the remainder of this document assumes that the data vector (e.g. data vector 102 from FIG. 1) comprises K bits, each of which can take a value of '0' or '1'. However, it is envisaged for the appreciation of those skilled in the relevant art that the concepts described herein may be also applied to non-binary LDPC codes.

Therefore, in accordance with the inventive concepts described herein, an LDPC encoder converts the data vector comprising K bits into a vector y (e.g. vector y 105 from FIG. 1) of N' encoded bits, which may be stored or transmitted. During unreliable storage or transmission, the vector y of N' encoded bits is exposed to errors and is typically converted into a vector 106 of N' encoded soft bits, which express how likely each of the N' encoded bits of vector y is to have a value of '0' or '1'. Typically, each soft bit is represented using a Logarithmic Likelihood Ratio (LLR), where:

$$LLR = \ln\frac{Pr(\text{bit}=0)}{Pr(\text{bit}=1)}.$$

Hence for the sake of simplicity, the remainder of this document assumes that all soft bits are expressed using LLRs. However, those skilled in the relevant art will also recognize how the inventive concepts described herein may be also applied to other representations of soft bits or soft non-binary symbols in the case of non-binary LDPC codes.

In accordance with some examples described herein, an LDPC decoder implementation comprising control, datapath and memory components may be used to convert the vector 106 of N' encoded soft bits into a vector comprising K decoded bits. In general, an LDPC decoder can be designed to support any number of basegraphs at run-time, having any dimensions and sets of supported lifting factors Z. However, for the sake of simplicity, this document considers an implementation that is specifically designed to offer run-time support for both 3GPP New Radio basegraphs and all corresponding lifting factors Z. However, those skilled in the relevant art will also recognize how the inventive concepts described herein may also be applied to other LDPC code basegraphs and sets of supported lifting factors Z.

Different memories within in an LDPC decoder implementation may be used for different purposes, including the storage of LLRs associated VNs. Each VN memory may comprise one or more addresses, each of which may store sets of P LLRs. Furthermore, in accordance with some examples described herein, each VN memory may include one or more sub-memories, which may be implemented using different physical memory devices, such as Random Access Memories (RAMs). Alternatively, in accordance with some examples described herein, the sub-memories may be implemented as virtual memories occupying different address spaces within the same physical memory. Furthermore, in accordance with some examples described herein, each VN memory may include registers and circuitries that allow sets of LLRs spanning across two or more addresses to be read or written together. Those skilled in the relevant art will also recognize how the inventive concepts described herein may be adapted to adopt one or more or each of these different options.

Figure 6:
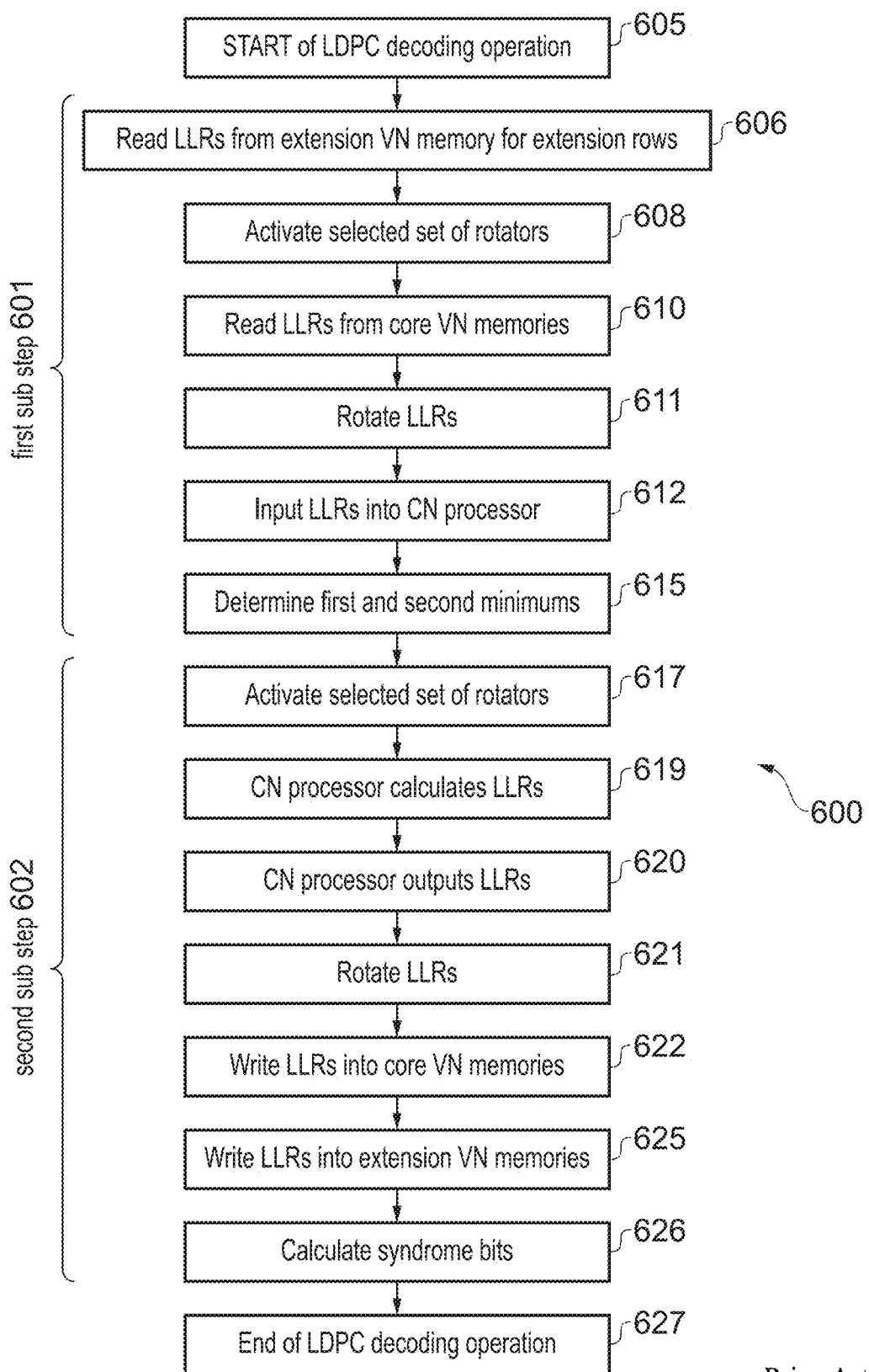
FIG. 6 illustrates a known flow chart for the operation of a LDPC decoding process for a row-parallel layered belief propagation implementation.

The LDPC decoding process is completed over a number of operations, as illustrated in the known flowchart 600 of FIG. 6. To aid an appreciation of the inventive concepts of the present invention, let us first consider and elaborate on one aspect of the known LDPC decoding process approach. Each operation of the flowchart 600 processes LLRs associated with P rows within the same blockrow of the PCM, where these rows are typically consecutive. Typically, the complete set of rows within a blockrow are processed during a group of ceil(Z/P) consecutive operations, with each successive operation of the flowchart 600 typically processing successive sets of P rows in order. Cases where Z is not divisible by P may be handled using a number of methods, which include deactivating some of the processing in some operations, or performing processing for dummy LLRs associated with an additional number of dummy rows in order to increase the number of rows in the blockrow to a multiple of P. Indeed, in accordance with some examples described herein, it may be considered that dummy rows can be processed without activating the processing required for actual rows of the PCM. Hence, it may be considered that all methods of handling values of Z that are not divisible by P are conceptual special cases of using dummy LLRs and of processing dummy rows. For the sake of simplicity, this is assumed throughout the rest of this document. In this way, each operation the LDPC decoding process operates on a set of P LLRs (which may include some dummy LLRs) that are required to complete the processing of the P rows (which may include some dummy rows) of the PCM.

Figure 4:
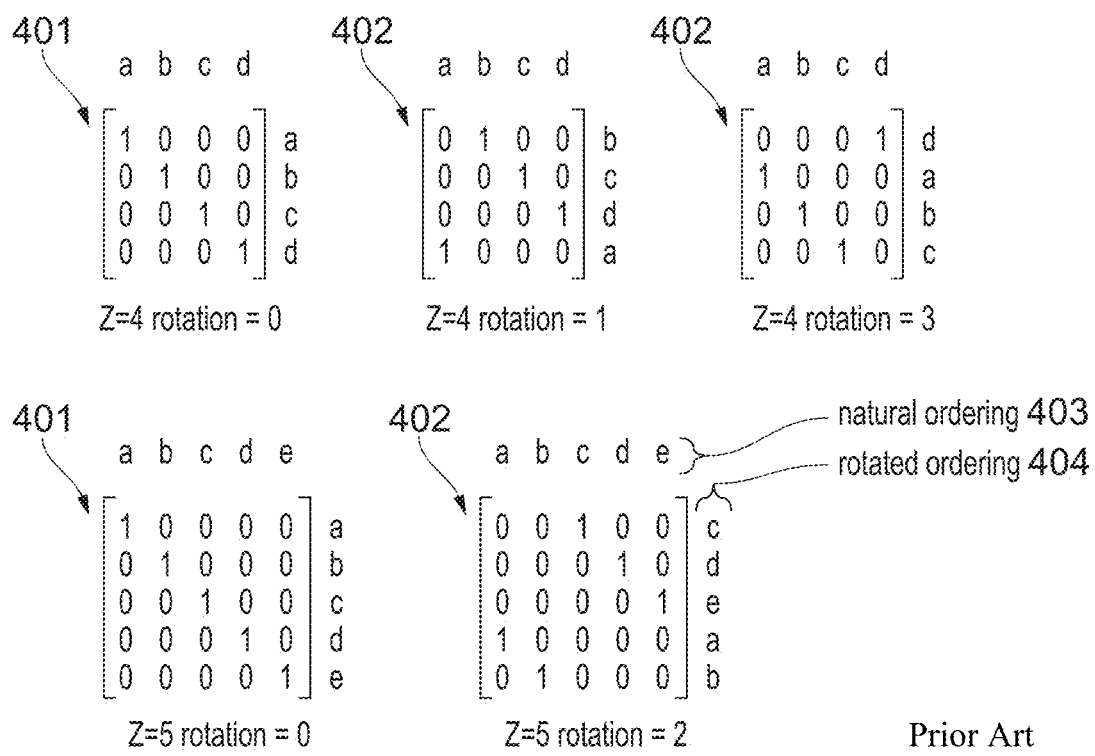
FIG. 4 illustrates a known matrix interpretation of various example rotations applied with exampling lifting factors Z, in order to convert between natural and rotated orderings of variables.

In some examples of the invention, different datapath components within an LDPC decoder implementation may be used for different purposes, including performing the rotation of LLRs being written into VN memories, during a second sub-step 602 in each operation of an LDPC decoding process. Here, the rotators may be configured to undo the rotation that was applied during the first sub-step 601 of the current operation of the LDPC decoding process. In this case, each set of P LLRs may be written in their natural ordering (for example as shown at 403 in FIG. 4), in place of the LLRs that were read from the corresponding core VN memory during the first sub-step 601 of the current operation of the LDPC decoding process.

Alternatively, in some examples of the invention, the core VN memories may operate in a ping-pong manner with each set of P LLRs being written to a different sub-memory of the corresponding core VN memory to that which provided the LLRs during the first sub-step 601 of the current operation in the LDPC decoding process. This ping-pong arrangement allows the LLRs to be written into the core VN memories 503 using a rotated ordering (for example as shown at 404 in FIG. 4). This can avoid the requirement for the rotators to perform a rotation during both the reading of LLRs from the corresponding core VN memory and the writing of LLRs to that core VN memory, instead requiring a rotation to be performed during only one or other of these operations. Note that, in accordance with some examples described herein, avoiding a rotation may be considered to be equivalent to performing a rotation by zero positions and that this may be implemented by using an internal bypass within the rotator. For the sake of simplicity, this is assumed throughout the remainder of this document. Note that, in accordance with some examples described herein, some rotators may remain activated between the first sub-step 601 and the second sub-step 602, without the requirement for the second rotator activation at 617 operation to do anything. However, this no-operation may be considered to be a special case of the second rotator activation 617 operation, as is assumed throughout the remainder of this document.

Figure 5:
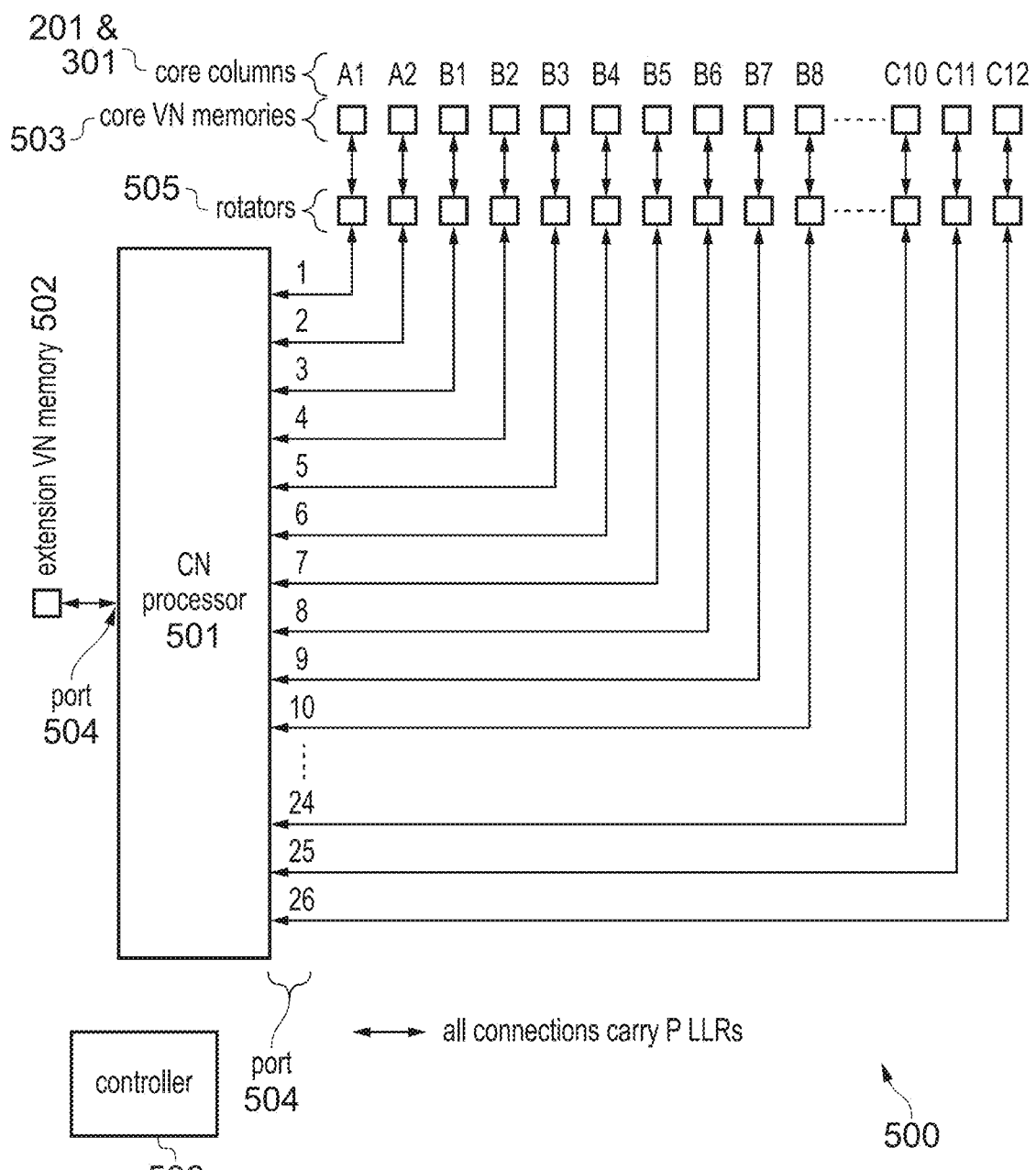
FIG. 5 illustrates a known row-parallel layered belief propagation implementation of an LDPC decoder, with application for the 3GPP New Radio LDPC code.

Note that the processing of each sub-step 601, 602 within each operation of the LDPC decoding process may be spread over a number of consecutive clock cycles, each having different dedicated hardware in a practical implementation (such as illustrated in FIG. 5). Likewise, the processing of successive operations in the same row of the basegraph may be pipelined, and the processing of successive orthogonal rows in the basegraph may be pipelined.

The LDPC decoding process may continue until a fixed number of decoding iterations have been performed, or until some or all of the syndrome bits associated with the rows in the PCM have binary values of '0'. Following the completion of the decoding iterations within the LDPC decoding process, a vector of N' decoded LLRs may be obtained by concatenating the sets of Z LLRs that were most recently stored in the VN memories 502 and 503. Note that, in accordance with some examples described herein, when a ping-pong memory arrangement is employed for the core VN memories, it may be necessary to undo any rotation that was most recently applied to the LLRs, in order to restore their natural ordering.

A Novel LDPC Decoder Implementation Having Reduced Hardware Requirement

Figure 7:
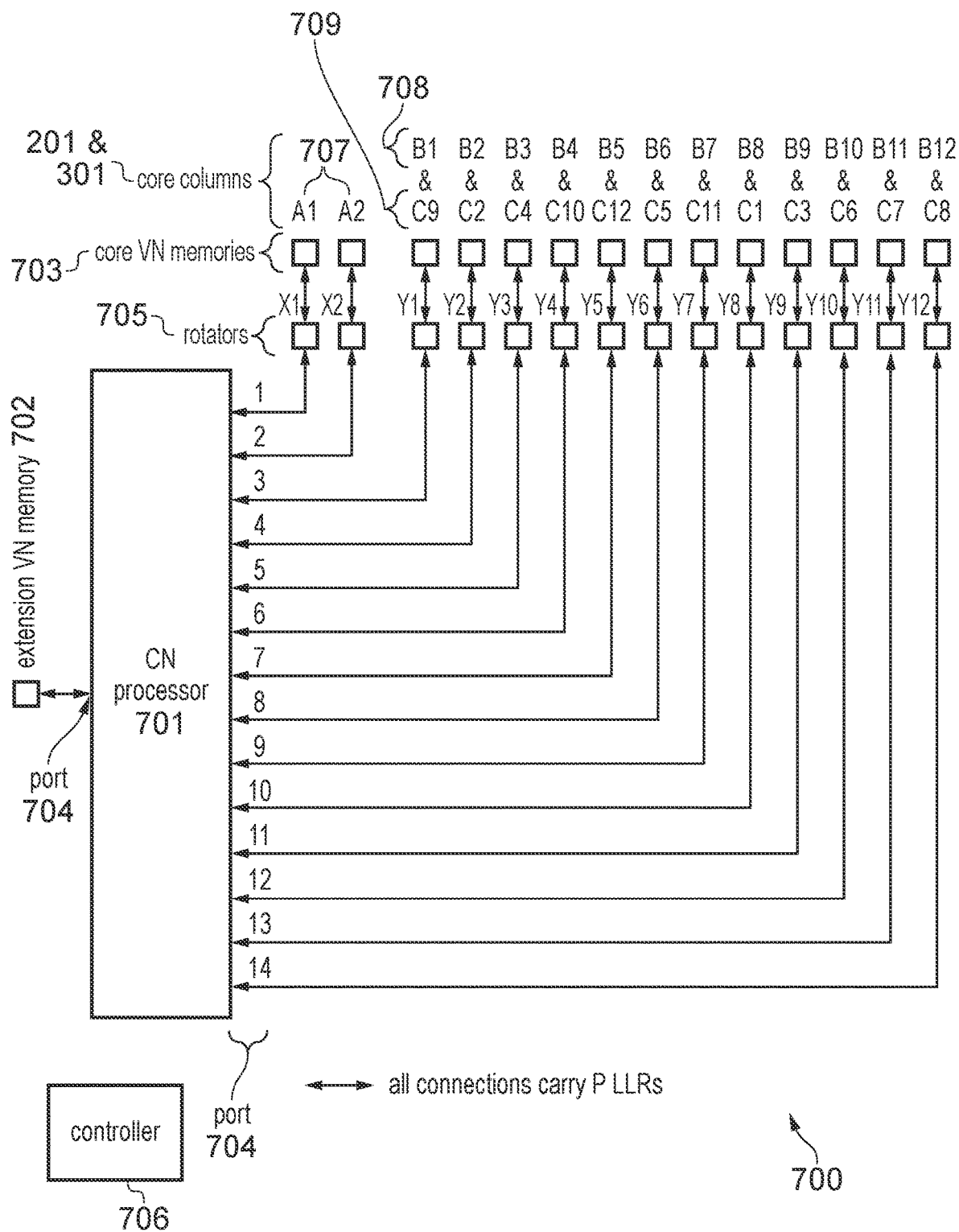
FIG. 7 illustrates an example embodiment of a LDPC decoder according to some examples of the invention, having a reduced hardware requirement, with application for the 3GPP New Radio LDPC code.

When applied to the 3GPP New Radio LDPC code, the conventional LDPC decoder implementation 500 described previously has a first problem, namely it includes a large hardware requirement. This may be attributed to the requirement for $n_{c,max}=26$ rotators 505, $n_{c,max}=26$ core VN memories 503 and a CN processor 501 having $n_{c,max}+1=27$ I-O ports 504. This motivates a novel LDPC decoder implementation 700 having a reduced hardware requirement, as exemplified in FIG. 7. Here, FIG. 7 illustrates an example embodiment of a LDPC decoder according to some examples of the invention, having a reduced hardware requirement, with application for the 3GPP New Radio LDPC code. More specifically, the proposed implementation 700 adopts a reduced number $n_{rot}$ of rotators 705, a reduced number $n_{rot}$ of core VN memories 703 and a CN processor 701 having a reduced number $n_{rot}+1$ of I-O ports 704, where $n_{rot} < n_{c,max}$. As in the conventional LDPC decoder implementation 500 described above, each operation within flowchart 800 of the LDPC decoding process completes the processing for a set of P rows in the PCM. In cases where the number of core columns (201 and 301) in the basegraph is no greater than $n_{rot}$, then each operation within flowchart 800 of FIG. 8 of the LDPC decoding process uses only a first sub-step 601 and a second sub-step 602, as in the conventional implementation 500.

In cases where the number of core columns (201 and 301) in the basegraph is greater than $n_{rot}$, but the number of binary values of '1' in the current row does not exceed $n_{rot}$, in accordance with some examples described herein, then it may be possible to carefully configure the proposed LDPC decoder implementation 700 such that the corresponding operation 800 within flowchart of the LDPC decoding process may be completed using only a first sub-step 601 and a second sub-step 602, as in the conventional implementation 500 and as will be exemplified below for the 3GPP New Radio LDPC code.

However, in cases where the number of binary values of '1' in the core columns (201 and 301) of the corresponding basegraph row exceeds $n_{rot}$, then each operation within flowchart 800 of the LDPC decoding process comprises a first set of two or more sub-steps 801 and a second set of two or more sub-steps 802. With careful configuration, in accordance with some examples described herein, the number of further sub-steps 803 within respective first set of sub-steps 801 and further sub-steps 804 within respective second set of sub-steps 801 can be minimised, as will be exemplified below for the 3GPP New Radio LDPC code.

Hence, the novel LDPC decoder implementation 700 has a significantly reduced hardware requirement but maintains the same performance as the conventional implementation (500) in all but a small number of cases. More specifically, in the case of the 3GPP New Radio LDPC code, the number of rotators 705 and core VN memories 703 is reduced from $n_{c,max}=26$ to $n_{rot}=14$, while the number of CN processor I-O ports 704 is reduced from $n_{c,max}+1=27$ to $n_{rot}+1=15$, as will be detailed below. Advantageously, this is achieved without increasing the number of sub-steps required during any of the processing, except during the processing of the 4 core rows of BG1, where the number of sub-steps is doubled.

The novel LDPC decoder implementation 700 performs an LDPC decoding process using a number of iterations, where each iteration completes one pass of processing over the PCM. Each iteration is comprised of processing performed for each blockrow of the PCM, where the order in which the blockrows are processed within each iteration is dictated by a layered belief propagation schedule. The processing of each blockrow of the PCM is comprised of a number of LDPC decoding operations, where each operation performs processing for a set of P rows within the blockrow and where the processing of one LDPC decoding operation is depicted in the flowchart 800 of FIG. 8.

Figure 8:
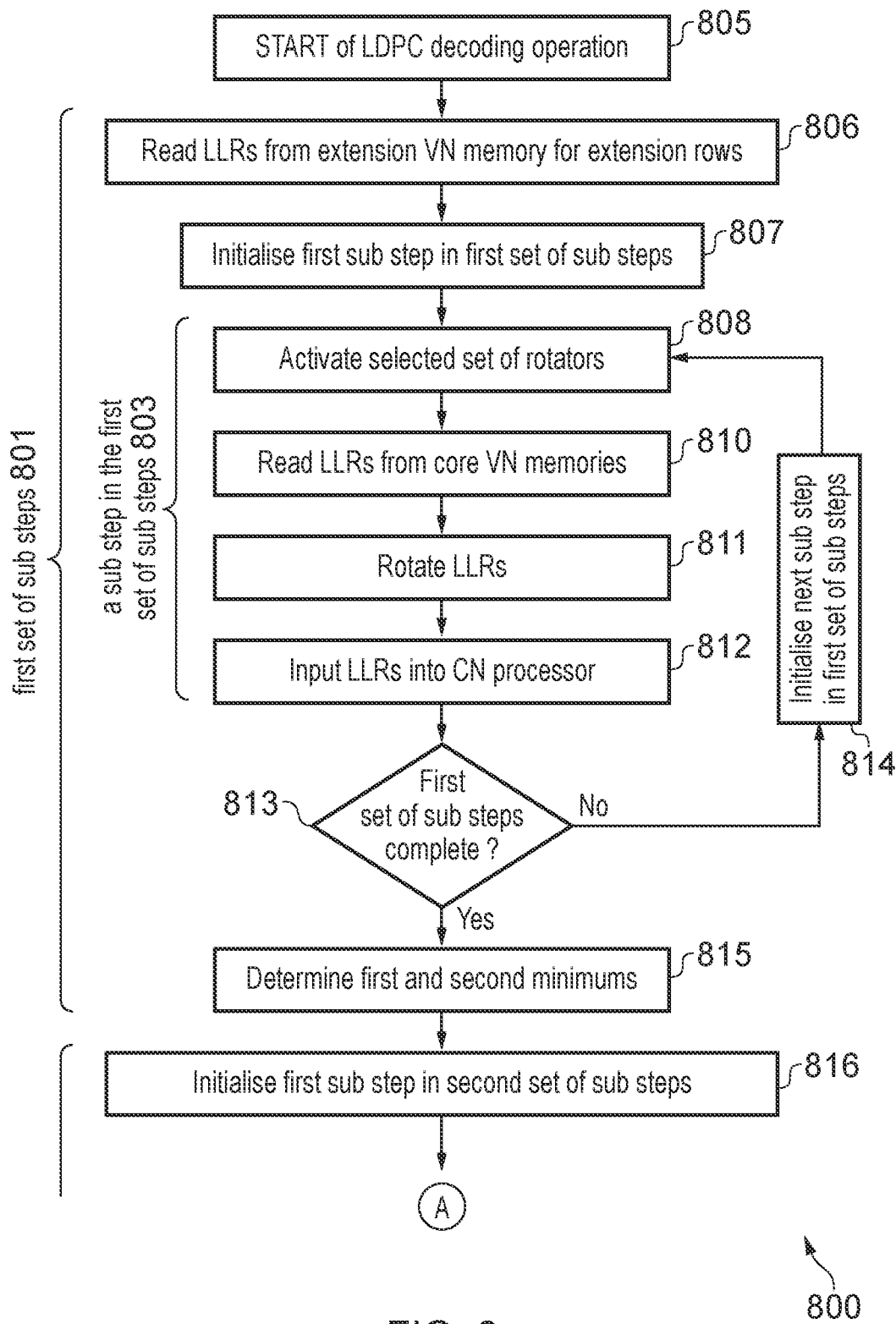
FIG. 8 illustrates a flow chart for the operation of a LDPC decoding process for an example embodiment of the LDPC decoder having a reduced hardware requirement, according to some examples of the invention.
Figure 8:
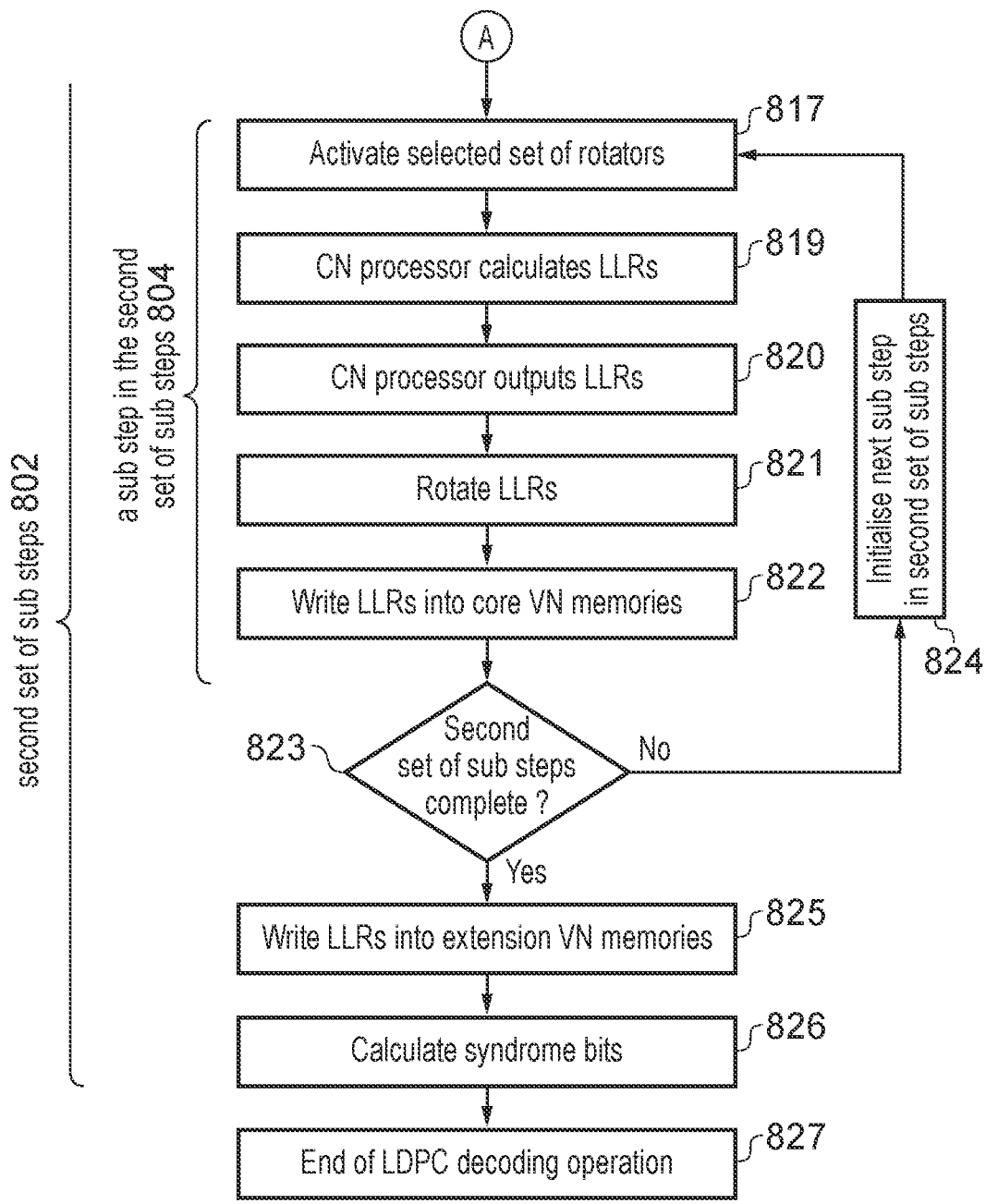

More specifically, FIG. 8 illustrates a flow chart for the operation of a LDPC decoding process for an example embodiment of the LDPC decoder having a reduced hardware requirement. Each LDPC decoding operation comprises a first set of sub-steps and a second set of sub-steps, as shown in FIG. 8. A number of processes are performed during each sub-step and these may be spread over a number of consecutive clock cycles.

More specifically, in accordance with some examples described herein and as shown in FIG. 8, the processing performed in each operation within flowchart 800 of the LDPC decoding commences 805 by completing a first set of sub-steps 801 and a second set of sub-steps 802, before concluding 827. The first set of sub-steps 801 comprises VN memory reading 806, initialising its first sub-step 807, completing the sub-step (808 to 812), determining whether a next sub-step is required 813, initialising the next sub-step if required 814 or performing CN processor calculations 815 otherwise. Each sub-step 803 in the first set of sub-steps 801 comprises rotator activation 808, VN memory reading 810, rotation 811 and CN processor inputting 812. The second set of sub-steps 802 comprises initialising its first sub-step 816, completing the sub-step (817 to 822), determining whether a next sub-step is required 823, initialising the next sub-step if required 824 or VN memory writing 825 and syndrome bit calculation 826 otherwise. Each sub-step 804 in the second set of sub-steps 802 comprises rotator activation 817, CN processor further calculation 819, CN processor outputting 820, rotation 821 and VN memory writing 822.

In the general case, each of the $n_{rot}$ rotators 705 (together with its corresponding core VN memories 703 and its corresponding CN processor I-O port 704) is allocated to a non-overlapping set of core columns (201 and 301) in each supported basegraph, in a one-to-many arrangement. More specifically, in some examples of the invention, rotations associated with each column in each basegraph are performed by a particular one of the rotators 705, where each rotator performs rotations for a set of one or more columns, with at least one of the rotators performing rotations for two or more columns in a same basegraph. In this manner, a reduced number of rotators 705 can be used and the hardware resource requirement can be reduced.

As shown in FIG. 8, in accordance with some examples described herein, during each sub-step (e.g. sub-steps 803 and 804) in each set of sub-steps (e.g. sub-steps 801 and 802) within each operation within flowchart 800 of the LDPC decoding process performed within a particular row of a basegraph, a non-overlapping subset of the core columns (201 and 301) in that row having binary values of 1 and having different allocated rotators 705 is selected. Note that in some cases, the subset may comprise one, some or all of the core columns. These rotators 705 and their corresponding core VN memories 703 and CN processor I-O ports 704 are activated within the sub-step (803 and 804) and used to enable processing of the selected core columns (201 and 301). More specifically, the rotator 705, core VN memory 703 and CN processor I-O port 704 associated with a core column (201 and 301) having a binary value of 1 in a particular row of a basegraph are activated in a particular one of the sub-steps in each set of sub-steps (801 and 802) performed during the processing of that row. The selection of which sub-step is used for each core column (201 and 301) is chosen to avoid the processing of more than one column that shares the same rotator 705 in the same sub-step. A number of sub-steps (e.g. sub-steps 803 and 804) are completed until all core columns (201 and 301) in the row having binary values of 1 have been selected and processed.

During each sub-step 803 in the first set of sub-steps 801, each of the activated core VN memories 703 are read under the direction of the controller 706, in order to provide the required set of P LLRs. Furthermore, each of the activated rotators 705 is configured to rotate these P LLRs into the required order, under the direction of the controller 706. Each activated rotator 705 provides the corresponding set of P LLRs to the input of the corresponding I-O port 704 of the CN processor 701.

Furthermore, during one of the sub-steps in the first set of sub-steps 801 in each operation within flowchart 800 of the LDPC decoding process that corresponds to an extension row (204 and 304) in the basegraph, the CN processor 701 may also be provided with a set of P LLRs that are read from the extension VN memory 702. More specifically, these LLRs are provided by the particular sub-memory in the extension VN memory 702 that is mapped to that extension row (204 and 304). By contrast, the extension VN memory 702 is deactivated during all other circumstances in the first set of sub-steps 801.

The activated subset of the connections to the inputs of the I-O ports 704 of the CN processor 701 each provide it with a set of P LLRs in each 803 of the first set of sub-steps 801 of each operation within flowchart 800 of the LDPC decoding process. Note that in some cases, the subset may comprise one, some or all of the connections to the inputs of the I-O ports 704. As in the conventional LDPC decoder implementation 500, the CN processor 701 may operate using a variety of algorithms [3], including the sum-product, min-sum, normalised min-sum, offset min-sum or adjusted min-sum, for example. In the case of the min-sum algorithm, we may represent the input LLRs using the notation $a_{s,i,p}$ where s is in the range 1 to S and indicates which sub-step 803 in the first set of S sub-steps 801 is being performed, i is in the range 1 to A and indicates which of the A activated I-O ports 704 the LLR is provided on and p is in the range 1 to P and indicates which of the P LLRs provided on that I-O port 704 this LLR is. In a first calculation, the CN processor 701 may perform a calculation $b_{s,i,p}=a_{s,i,p}-m_{s,i,p}$ corresponding to each input LLR $a_{s,i,p}$, where $m_{s,i,p}$ is a corresponding internally stored value which is initialised to 0 at the start of the LDPC decoding process and which is updated in each iteration of the processing of the P rows in the PCM. Across the sequence of sub-steps 803 during the first set of sub-steps 801, the first and second minimum of the absolute values $|b_{s,i,p}|$ is identified for each value of p and the corresponding values of the indices s and i are referred to as min1 and min2, respectively. Furthermore, the product of the signs sign($b_{s,i,p}$) is identified for each value of p and referred to as $sign_p$.

In each of the second set of sub-steps 802 within flowchart 800, the CN processor 701 may perform a calculation $m_{min1,min1,p}=sign(b_{s,i,p}) \times sign_p \times |b_{min2,min2,p}|$ corresponding to the input LLR $a_{s,i,p}$ having the indices s and i that correspond to min1 for each value of p. Meanwhile, a calculation $m_{s,i,p}=sign(b_{s,i,p}) \times sign_p \times |b_{min1,min1,p}|$ is performed corresponding to all other input LLRs for each value of p. Here, the value of $m_{s,i,p}$ is written into the internally stored value for each combination of s, i and p, so that it can be used during the next iteration of the processing of the P rows, as described above.

Finally, the CN processor 701 may perform a calculation $d_{s,i,p}=b_{s,i,p}+m_{s,i,p}$, in order to obtain an output LLR $d_{s,i,p}$ for each of the P LLRs provided as outputs on each of the A activated I-O ports 704 in each of the S sub-steps 804, in correspondence with the input LLR $a_{s,i,p}$. Note that the notation here assumes that the set of rotators 705, core VN memories 703 and CN processor I-O ports 704 that are activated during each 804 of the second set of sub-steps 802 is the same as in the correspond sub-step 803 in the first set of sub-steps 801. In other arrangements, a different activation arrangement may be used for the two sets of sub-steps (801 and 802), and more complicated notation would be required.

Furthermore, each sub-step 804 in the second set of sub-steps 802 within flowchart 800 of the LDPC decoding process proceeds with each of the activated rotators 705 being configured to rotate the set of P LLRs that it is provided with into an order that is appropriate for storage in the corresponding activated core VN memory 703. As in the enhanced and generalized LDPC decoder implementation, a ping-pong arrangement may be employed to avoid the requirement for rotations during one or other of the sets of sub-steps (801 and 802).

Furthermore, during one of the sub-steps in the second set of sub-steps 802 within flowchart 800 of the LDPC decoding process, the CN processor 701 may also calculate syndrome bits corresponding to the P associated rows of the PCM. Additionally, during one of the sub-steps in the second set of sub-steps 802 within flowchart 800 of the LDPC decoding process that corresponds to an extension row (204 and 304) in the basegraph, the CN processor 701 may provide a set of P LLRs to the extension VN memory 702, which may be written to the sub-memory that is mapped to the extension row (204 and 304).

Note that, in accordance with some examples of the invention, the processing of each sub-step 803, 804 within each operation of the LDPC decoding process may be spread over a number of consecutive clock cycles, each having different dedicated hardware in a practical implementation (such as illustrated in FIG. 7). Furthermore, in accordance with some examples of the invention, the processing of successive sub-steps in the same set of sub-steps 801, 802 may be pipelined, such that the second clock cycle of a first sub-step 803, 804 is performed at the same time as the first clock cycle of a second sub-step 803, 804, for example. Likewise, in accordance with some examples of the invention, the processing of successive operations in the same row of the basegraph may be pipelined, and the processing of successive orthogonal rows in the basegraph may be pipelined.

A Novel 3GPP New Radio LDPC Decoder Implementation Having Reduced Hardware Requirement In an example embodiment for the 3GPP New Radio LDPC code, $n_{rot}=14$ rotators 705, $n_{rot}=14$ core VN memories 703 and a CN processor 701 having $n_{rot}+1=15$ I-O ports 704 may be adopted. Here, each rotator 705 is connected to a different I-O port 704 of the CN processor 701, as in the conventional LDPC decoder implementation 500, but with the difference that there are fewer rotators 705 and I-O ports 704 of the CN processor 701 in the proposed implementation 700. Hence, the example embodiment for the 3GPP New Radio LDPC code achieves a significantly reduced hardware requirement than the conventional LDPC decoder implementation 500.

In the case of BG1 200, the allocation of rotators 705 to core columns 201 may be carefully configured, in order to minimise the number of sub-steps required. More specifically, this allows each LDPC decoding operation within flowchart 800 for core rows 203 to be completed using first set of sub-steps 801 that comprises sub-step 803 and second set of sub-steps 802 that comprises sub-step 804, where each set of sub-steps comprises only S=2 sub-steps. Furthermore, this allows each LDPC decoding operation within flowchart 800 for extension rows 204 to be completed using first set of sub-steps 801 and second set of sub-steps 802 that each comprise only S=1 sub-step (803 and 804). Hence, the example embodiment for the 3GPP New Radio LDPC code requires the same number of sub-steps as the conventional LDPC decoder implementation 500 for all extension rows 204 and only requires additional sub-steps when processing the 4 core rows 203 of BG1 200, despite having a significantly reduced hardware requirement.

More specifically, in accordance with some examples described herein, the allocation of the $n_{c,1}$=26 core columns 201 in BG1 200 to the $n_{rot}$=14 rotators 705 may be carefully selected in order to avoid contention between two or more columns trying to access the same rotator at the same time. In order to detail this allocation, the $n_{c,1}$=26 core columns 201 in BG1 200 may be arranged into three groups, where group A 707 comprises the first two core columns (which are referred to as the punctured core columns), group B 708 comprises the next 12 core columns and group C 709 comprises the final 12 core columns. Likewise, the $n_{rot}$=14 rotators 705 may be arranged into two groups, where group X 901 comprises the first two rotators 705 and group Y 902 comprises the other 12 rotators 705. The rotators 705 may be allocated to the core columns 201 as listed in FIG. 9, where A1 represents the first core column in group A, X2 represents the second rotator 705 in group X 901 and so on. Note that this novel grouping of core columns and rotators enables the efficient reuse of rotators for more than one core column, which reduces the hardware resource requirement of the present invention. More specifically, in accordance with some examples described herein, FIG. 9 illustrates a mapping between rotators and core columns of BG1 and BG2 from the 3GPP New Radio LDPC code, for an example embodiment of the LDPC decoder.

Figure 9:
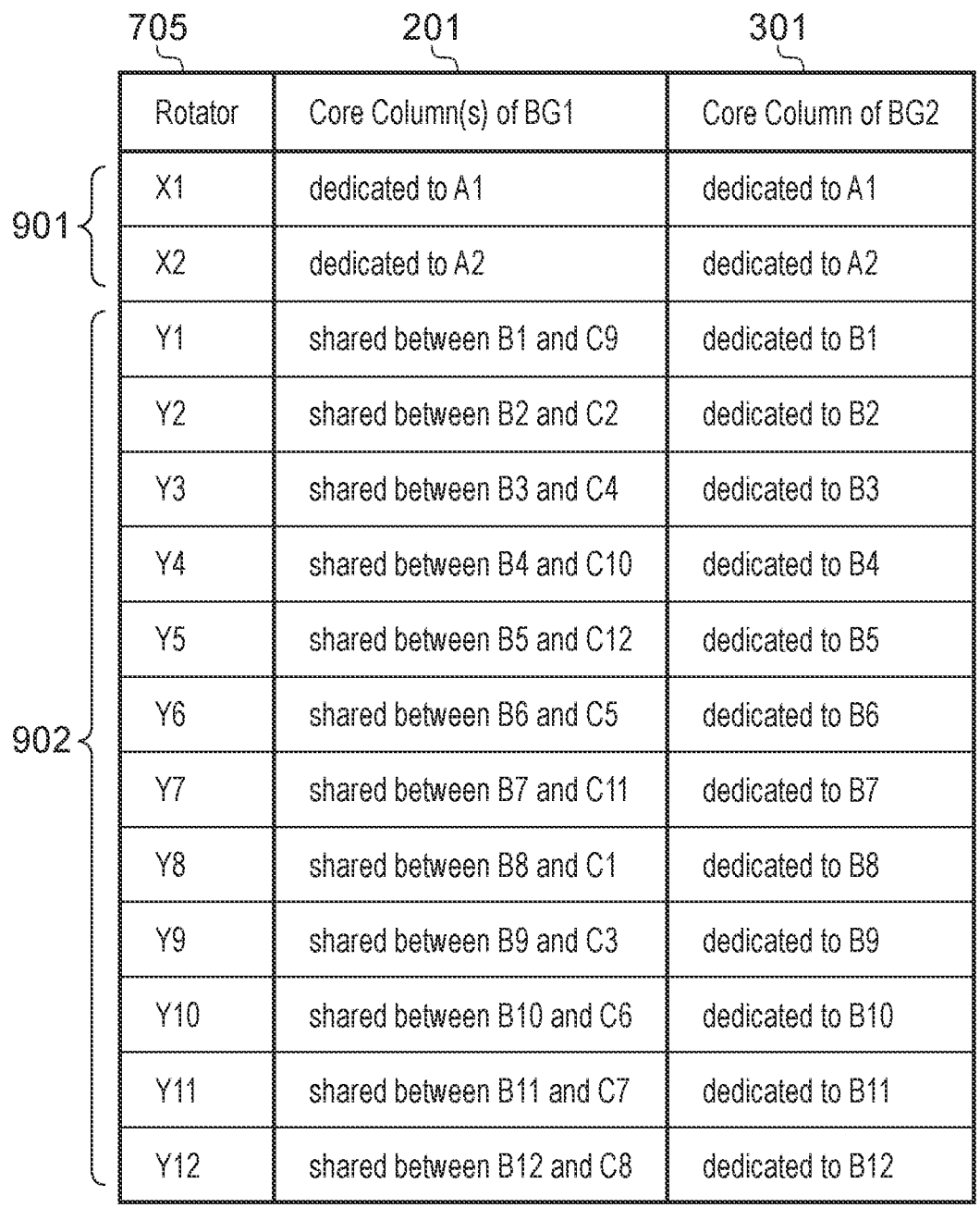
FIG. 9 illustrates a mapping between rotators and core columns of BG1 and BG2 from the 3GPP New Radio LDPC code, for an example embodiment of the LDPC decoder according to some examples of the invention.

In the arrangement of FIG. 9, each rotator 705 in group X 901 is allocated only to the corresponding punctured core column in group A 203 of BG1 200, which is motivated owing to the high density of binary values of 1 within these punctured core columns 707 of BG1 200. By contrast, each rotator 705 in group Y 902 is allocated to a particular core column in group B 708 and also to a particular core column in group C 709, which is motivated by the low density of binary values of '1' in the intersection of these core columns 201 and the extension rows 204 in BG1 200. Note that in each case, the pair of columns in groups B and C that are allocated to each rotator 705 in group Y 902 are orthogonal to each other in all extension rows 204 of BG1 200. Furthermore, these pairings also preserve the orthogonality between each even-indexed row (assuming indexing starts at '0') and the row below it in the last 26 rows of BG1 200, as will be exploited in the novel LDPC decoder implementation 1200 having reduced number of operations, as will be discussed below.

Each of the rotators 705 is allocated to a corresponding core VN memory (e.g. VN memory 703 from FIG. 7), where the core VN memories 703 associated with the rotators 705 in group Y 902 have two sub-memories, which store LLRs associated with the two columns.

The arrangement of FIG. 9 enables each operation within flowchart 800 of the LDPC decoding process completed within an extension row of BG1 200 to be completed using only a first sub-step 601 and a second sub-step 602, as in the conventional implementation 500. More specifically, even though the number of core columns 201 in BG1 200 $n_{c,2}$=26 is greater than $n_{rot}$=14, the maximum number of binary values of 1 in the core columns 201 of any extension row in BG1 200 is 9, which is less than $n_{rot}$=14. Owing to the orthogonality between the pairings of the core columns in groups B 708 and C 709 in the allocations to rotators 705 in group Y 902, there are never any cases where any one of these rotators 705 is required to operate on both of its allocated columns during the processing of extension rows 204 of BG1 200. Hence, the complete set of LLRs required in any LDPC decoding operation within flowchart 800 for an extension row 204 of BG1 200 can always be rotated using a single sub-step (803 and 804). Hence, in accordance with some examples described herein, the activation of rotators 705, core VN memories 703 and CN processor I-O ports 704 is directed by the position of the binary values of 1 in the extension row 204 of BG1 200, as in the conventional LDPC decoder implementation 500. Furthermore, in accordance with some examples described herein, the operation of the extension VN memory 702 and the CN processor 701 may be executed in the same way as in the conventional LDPC decoder implementation 500, in the case of each operation within flowchart 800 of the LDPC decoding process completed within an extension row 204 of BG1 200.

The arrangement of FIG. 9 enables each operation within flowchart 800 of the LDPC decoding process completed within a core row 203 of BG1 200 to be completed using only S=2 sub-steps (803 and 804) in each of the first 801 and second 802 sets of sub-steps. Binary values of 1 in the columns of group A 707 are used to activate the associated rotators 705, core VN memories 703 and CN processor I-O ports 704 in one of the S=2 sub-steps (803 and 804) in each set of sub-steps (801 and 802). These rotators 705, core VN memories 703 and CN processor I-O ports 704 are deactivated in the other of the S=2 sub-steps (803 and 804) in each set of sub-steps (801 and 802). Similarly, binary values of 1 in the columns of group B 708 are used to activate the associated rotators 705, core VN memories 703 and CN processor I-O ports 704 in one of the S=2 sub-steps (803 and 804) in each set of sub-steps (801 and 802), while binary values of 1 in the columns of group C 709 are used to activate the associated rotators 705, core VN memories 703 and CN processor I-O ports 704 in the other of the S=2 sub-steps (803 and 804) in each set of sub-steps (801 and 802). For example, during the first sub-step (803 and 804) in each of the two sets of sub-steps (801 and 802), binary values of 1 in the columns of groups A and B (707 and 708) of the corresponding core row 203 of BG1 200 may be used to activate the associated rotators 705, core VN memories 703 and CN processor I-O ports 704. By contrast, during the second sub-step (803 and 804) in each of the two sets of sub-steps (801 and 802), binary values of 1 in the columns of group C 709 of the corresponding core row 203 of BG1 200 may be used to activate the associated rotators 705, core VN memories 703 and CN processor I-O ports 704.

In the case of BG2 300, each rotator 705 and its corresponding core VN memory 703 may be allocated to a different one of the $n_{c,2}$=14 core columns 301. Owing to this, each LDPC decoding operation within flowchart 800 may be completed using first 801 and second 802 sets of sub-steps that each comprise only S=1 sub-step (803 and 804), as in the conventional LDPC decoder implementation 500, albeit with a significantly reduced hardware requirement. More specifically, the $n_{c,2}$=14 core columns 301 in BG2 300 may be arranged into two groups, where group A 707 comprises the first two core columns (which are referred to as the punctured core columns 707) and group B 708 comprises the final 12 core columns. The rotators 705 in groups X 901 and Y 902 may be allocated to the core columns 301 as listed in FIG. 9. In the arrangement of FIG. 9, each rotator 705 in group X 901 is allocated only to the corresponding punctured core column in group A 303 of BG2 300, while each rotator 705 in group Y 902 is allocated only to the corresponding core column in group B 708. Hence, the arrangement of FIG. 9 for BG2 300 is similar to that of BG1 200, but with the removal of core column group C 709. Hence, the example embodiment for the 3GPP New Radio LDPC code advantageously requires only the same number of sub-steps as the conventional LDPC decoder implementation 500 when processing BG2 300, despite having a significantly reduced hardware requirement.

In summary, in accordance with some examples described herein, the novel LDPC decoder implementation 700 has a significantly reduced hardware requirement, but maintains the same performance as the conventional implementation 500 of FIG. 5 in all but a small number of cases. More specifically, in the case of the 3GPP New Radio LDPC code, the number of rotators 705 and core VN memories 503, 703 is reduced from $n_{c,max}=26$ to $n_{rot}=14$, while the number of CN processor I-O ports 704 is reduced from $n_{c,max}+1=27$ to $n_{rot}+1=15$. This is achieved without increasing the number of sub-steps required during any of the processing, except during the processing of the four core rows of BG1, where the number of sub-steps is doubled.

A Novel LDPC Decoder Implementation Having Reduced Number of Operations

When applied to the 3GPP New Radio LDPC code, the conventional LDPC decoder implementation 500 described above has a second problem, namely the requirement to complete a large number of decoding operations, leading to a poor throughput and latency. This may be attributed to the requirement to complete one decoding operation for each set of P rows in the PCM, which is high when the PCM comprises a high number of rows. As described above, a number of extension rows (204 and 304) in the basegraphs of the 3GPP New Radio LDPC code are orthogonal to each other, as listed in FIG. 10 for BG1 200 and FIG. 11 for BG2 300. More specifically, in accordance with some examples described herein, FIG. 10 and FIG. 11 illustrate groupings of rows in BG1 and BG2 respectively from the 3GPP New Radio LDPC code, for an example embodiment of the LDPC decoder according to some examples of the invention having a reduced hardware requirement and reduced number of LDPC decoding operations. Note that the groups C to O 1009 and 1109 illustrate one possible pairing of orthogonal rows in BG1 200 and BG2 300, which are exploited in the proposed LDPC decoder implementation 1200. However, other pairings of orthogonal rows in these basegraphs are also possible.

Note that, these rows remain orthogonal to each other even when pairing the core columns 201 of BG1 200 in groups B and C according to the novel LDPC decoding implementation 700 having a reduced hardware requirement described above. Furthermore, it may be observed that there are a relatively low number of binary values of 1 in the core columns (201 and 301) of these orthogonal rows. Among the rows of BG1 200 listed in groups C to O 1009 of FIG. 10, the maximum number of binary values of 1 in the core columns 201 is 5. Likewise, among the rows of BG2 300 listed in groups C to O 1109 of FIG. 11, the maximum number of binary values of 1 in the core columns 301 is 4. Even when employing only $n_{rot}=14$ rotators 705, $n_{rot}=14$ core VN memories 703 and $n_{rot}+1=15$ CN processor I-O ports 704, most of these are disabled when processing these orthogonal rows. This motivates the processing of two or more orthogonal rows at the same time, in order to reduce the number of operations required to complete the LDPC decoding process and hence improve its throughput and latency.

Note that although orthogonality was deliberately designed into the 3GPP basegraphs, there remains a significant challenge of how to exploit this in a hardware efficient manner. More specifically, processing two or more orthogonal rows at the same time implies a requirement for a corresponding number of CN processors. Furthermore, the I-O ports of each CN processor must be operably coupled to the rotators and VN core memories that are allocated to the columns having a binary '1' value in the corresponding orthogonal row of the basegraph. A high degree of flexibility is required here because each CN processor is required to operate on different basegraph rows having different arrangements of binary '1' values, as the iterative decoder process progresses. In a naive implementation, a fully-connected interconnection network would be required to enable any combination of VN memories and rotators to be connected to any combination of CN processor I-O ports. However, this would imply a very large hardware resource requirement.

Motivated by this, the proposed LDPC decoder implementation 1200 employs a novel arrangement of CN processors and an incomplete interconnection network in order to significantly reduce the hardware resource requirement associated with the processing of two or more orthogonal rows at the same time. More specifically, rather than an any-to-any complete interconnection network, where any combination of inputs can be connected to any combination of outputs, the proposed LDPC decoder implementation 1200 employs a two-to-two incomplete interconnection network, in which each input can be connected to only two of the outputs and each output can be connected to only two of the inputs. This dramatically reduces the number of multiplexers required to implement the interconnection network. This feature of the proposed LDPC decoder implementation 1200 is enabled by the specific pairing of orthogonal rows to from groups C to O 1009 and 1109 in BG1 200 and BG2 300, as tabulated in FIG. 10 and FIG. 11.

Figure 12:
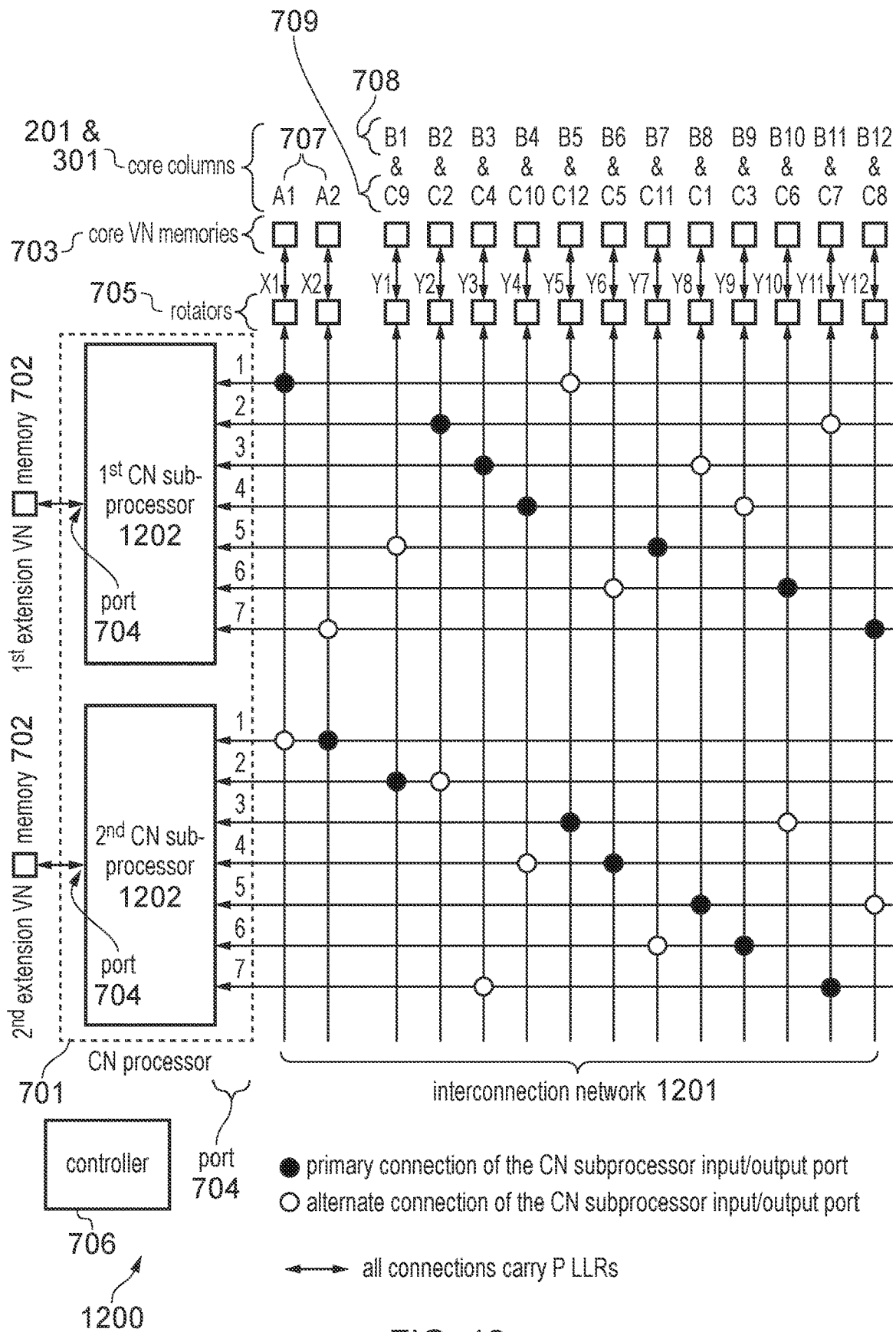
FIG. 12 illustrates a further example embodiment of the LDPC decoder according to some examples of the invention having a reduced hardware requirement and reduced number of LDPC decoding operations, with application for the 3GPP New Radio LDPC code.

This is achieved in the proposed LDPC decoder implementation 1200 having reduced number of operations, in accordance with some examples described herein, by internally dividing the CN processor 701 into two or more sub-processors 1202, as exemplified in FIG. 12. More specifically, FIG. 12 illustrates a further example embodiment of the LDPC decoder according to some examples of the invention having a reduced hardware requirement and reduced number of LDPC decoding operations, with application for the 3GPP New Radio LDPC code. Each of the CN sub-processors 1202 is capable of concurrently processing P rows of the PCM belonging to different orthogonal rows of the basegraph having low number of binary values of 1 in the core columns (201 and 301). Alternatively, the CN sub-processors 1202 can be operated together, in order to process P rows of the PCM belonging to a row of the basegraph having a high number of binary values of 1 in the core columns (201 and 301).

As in the conventional LDPC decoder implementation 500, the proposed LDPC decoder implementation 1200 comprises a number of rotators 1205, each of which is connected to a corresponding core VN memory 1203. However, rather than comprising only one extension VN memory 502 like the conventional LDPC decoder implementation 500 in FIG. 5, the proposed LDPC decoder implementation 1200 in accordance with some examples described herein comprises one extension VN memory 702 for each CN sub-processor 1202. Each extension VN memory 702 comprises a set of sub-memories, which are allocated to a different subset of the extension columns (202 and 302) in each supported basegraph. Note that in some cases, the subset may comprise one, some or all of the extension columns (202 and 302). Accordingly, the processing of each extension row (204 and 304) must include the CN sub-processor 1202 that is connected to the extension VN memory 702 associated with the corresponding extension column (202 and 302).

Different non-overlapping subsets of the CN processor's I-O ports 704 are allocated to each of the CN sub-processors 1202. Note that in some cases, the subsets may comprise one, some or all of the CN processor's I-O ports 704. More specifically, each of the CN processor's I-O ports 704 is mapped to a particular one of the CN sub-processors 1202. One I-O port 704 of each CN sub-processor 1202 is connected to its corresponding extension VN memory 702, while each of the remaining I-O ports 1204 is connected to a subset of the rotators 1205, via an interconnection network 1201. Under the direction of the controller 1206, the interconnection network 1201 selects which rotator 1205 from each subset to connect to each of these I-O ports 1204 in each sub-step of the LDPC decoding process. With careful configuration, the number of connections that are supported in the interconnection network 1201 can be minimised, as will be exemplified below for the 3GPP New Radio LDPC code.

In the general case, each operation of the LDPC decoding process may perform concurrent processing for a set of one or more orthogonal rows in the basegraph, where each of these rows is processed by a particular set of one or more CN sub-processors 1202. Note that, in accordance with some examples described herein, if any of the rows in a set of orthogonal rows has been deleted from the basegraph by puncturing, then the corresponding CN sub-processors 1202 can be deactivated during the corresponding operation of the LDPC decoding process, along with all associated rotators 1205 and core VN memories 1203. The processing of the other unpunctured rows in a set of orthogonal rows can continue as normal.

Figure 13:
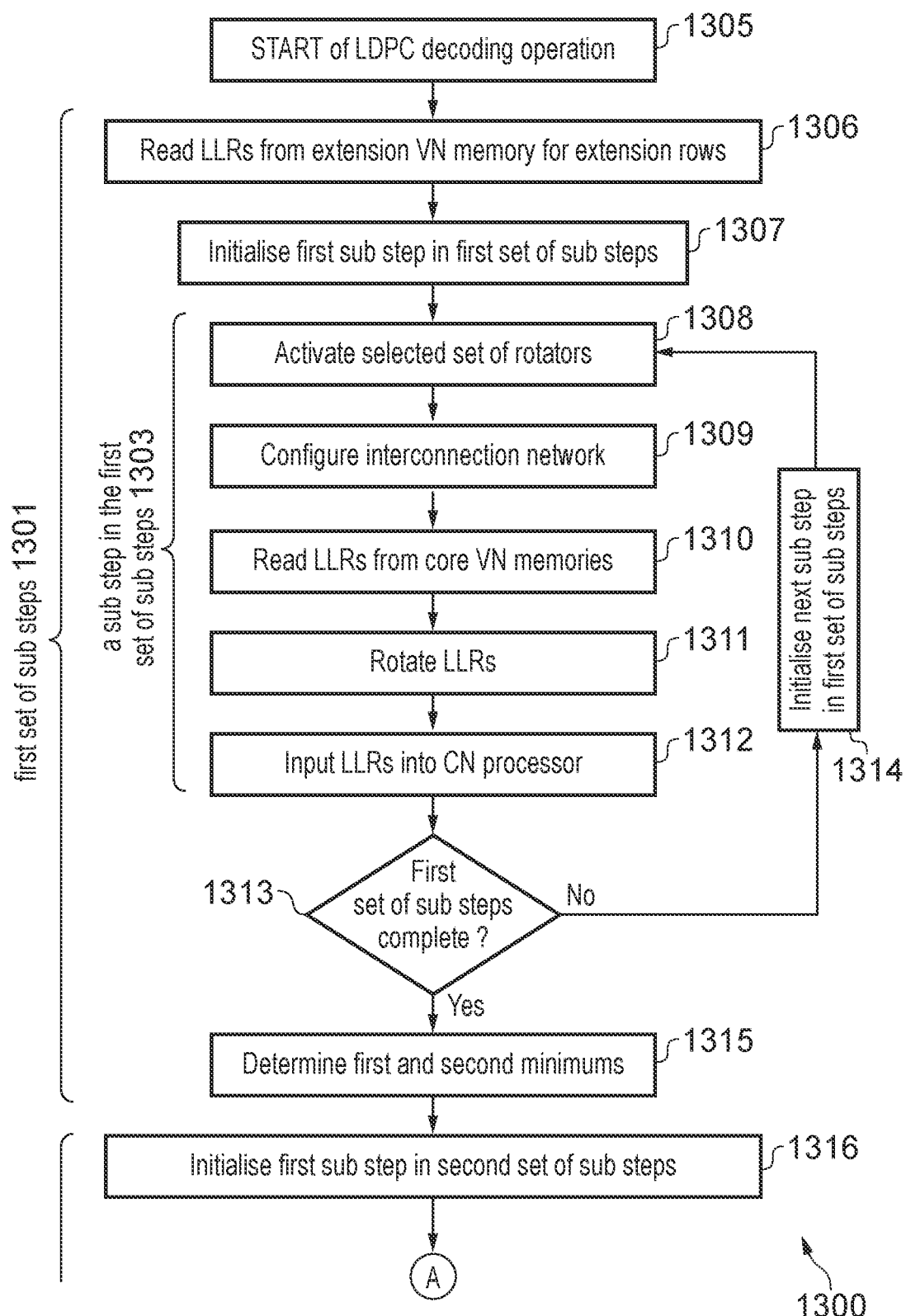
FIG. 13 illustrates a further flow chart for an operation of a LDPC decoding process for an example embodiment of the LDPC decoder according to some examples of the invention having a reduced hardware requirement and reduced number of LDPC decoding operations.
Figure 13:
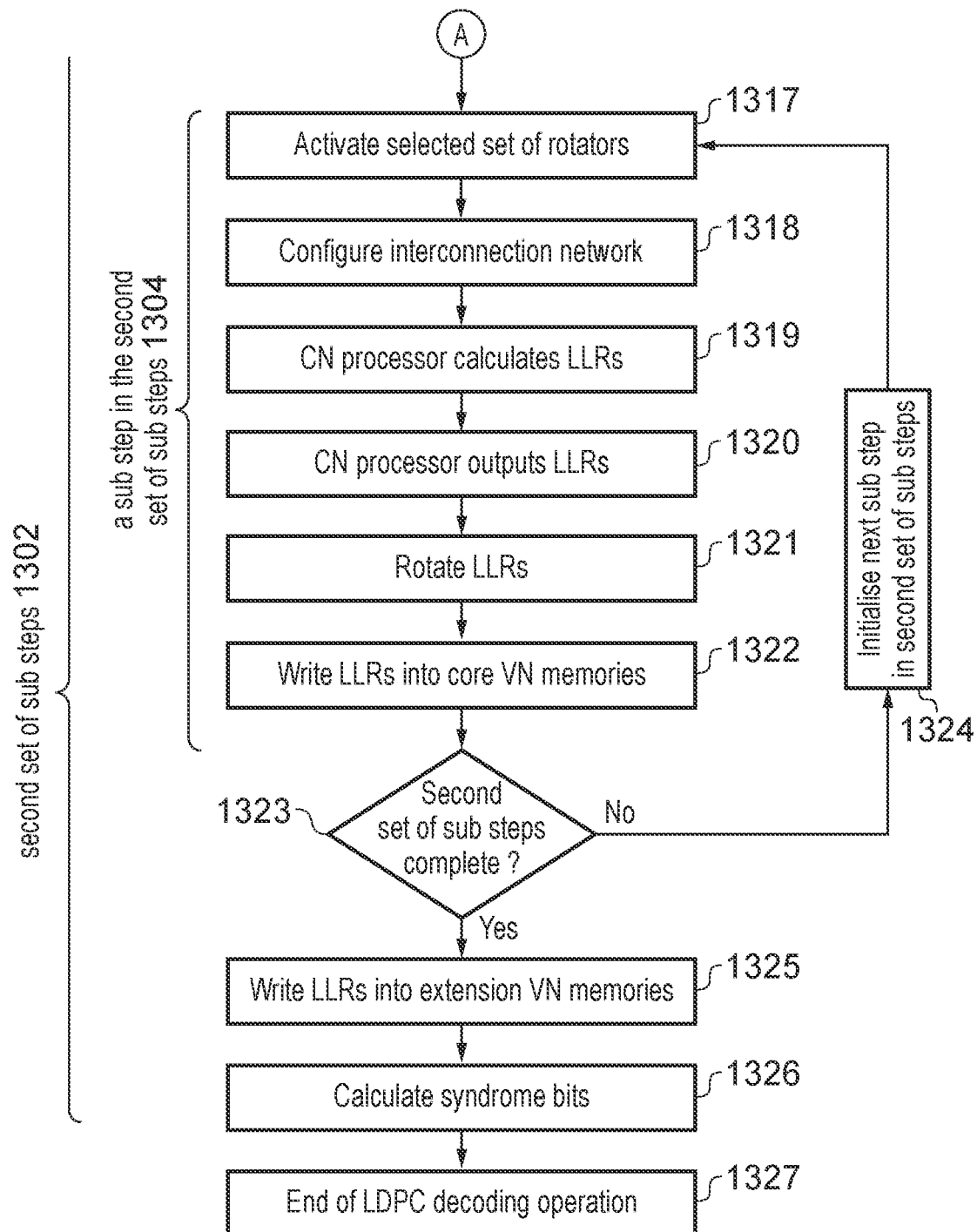

For the remainder of this section and unless explicit reference to the concurrent processing of multiple rows is made, the discussion focusses on the processing of a particular one of these rows, for which the number of allocated CN sub-processors 1202 is referred to as C. While the processing of the other rows in the orthogonal set will continue in parallel, the discussion will not focus on these, although it can be applied equally to them. As shown in FIG. 13, during the processing of the row, each binary value of 1 in a core column (201 and 301) of the row identifies a core VN memory 1203 and a rotator 1205 to activate, under the direction of the controller 1206. The interconnection network 1201 is configured to make the connection between each of these activated rotators 1205 and an I-O port 1204 of the corresponding set of C CN sub-processors 1202, under the direction of the controller 1206.

The novel LDPC decoder implementation 1200 performs an LDPC decoding process using a number of iterations, where each iteration completes one pass of processing over the PCM. Each iteration is comprised of processing performed for each blockrow of the PCM, where the order in which the blockrows are processed within each iteration is dictated by a layered belief propagation schedule. The processing of each blockrow of the PCM is comprised of a number of LDPC decoding operations, where each operation performs processing for a set of P rows within the blockrow and where the processing of one LDPC decoding operation is depicted in the flowchart 1300 of FIG. 13. More specifically, FIG. 13 illustrates a flow chart for an operation of a LDPC decoding process for an example embodiment of a LDPC decoder according to some examples of the invention having a reduced hardware requirement and reduced number of LDPC decoding operations. Each LDPC decoding operation comprises a first set of sub-steps and a second set of sub-steps, as shown in FIG. 13. A number of processes are performed during each sub-step and these may be spread over a number of consecutive clock cycles.

More specifically, in accordance with some examples described herein and as shown in FIG. 13, the processing performed in each operation 1300 of the LDPC decoding process for the row commences 1305 by completing a first set of sub-steps 1301 and a second set of sub-steps 1302, before concluding 1327. The first set of sub-steps 1301 comprises VN memory reading 1306, initialising its first sub-step 1307, completing the sub-step (1308 to 1312), determining whether a next sub-step is required 1313, initialising the next sub-step if required 1314 and performing CN processor calculation 1315 otherwise. Each sub-step 1303 in the first set of sub-steps 1301 comprises rotator activation 1308, VN memory reading 1310, rotation 1311, interconnection 1309 and CN processor inputting 1312. The second set of sub-steps 1302 comprises initialising its first sub-step 1316, completing the sub-step (1317 to 1322), determining whether a next sub-step is required 1323, initialising the next sub-step if required 1324, VN memory writing 1325 and syndrome bit calculation 1326 otherwise. Each sub-step 1304 in the second set of sub-steps 1302 comprises rotator activation 1317, CN processor further calculation 1319, CN processor outputting 1320, rotation 1321, interconnection 1318 and VN memory writing 1322.

Note that, in accordance with some examples described herein and when combined with the proposed LDPC decoder implementation 700 having reduced hardware requirement, each set of sub-steps 1301 and 1302 may comprise more than one sub-step 1303 and 1304. In this case, a different subset of the binary values of 1 in the core columns (201 and 301) of the row may be considered in each sub-step 1303 and 1304 in each of the two sets of sub-steps, as discussed above. Note that in some case, the subset may comprise one, some or all of the binary values of 1 in the core columns (201 and 301) of the row. For the sake of simplicity, the discussion below does not elaborate further on the operation or careful configuration that is required for the individual sub-steps (1303 and 1304) within each set of sub-steps 1301 and 1302. However, the discussion above for the proposed LDPC decoder implementation 700 having reduced hardware requirement is still applicable in this case, as will be demonstrated for the 3GPP New Radio LDPC code below.

During the first set of sub-steps 1301 performed for the row, each of the correspondingly activated core VN memories 703 are read under the direction of the controller 706, in order to provide the required set of P LLRs. Furthermore, in accordance with some examples described herein, each of the correspondingly activated rotators 705 is configured to rotate these P LLRs into the required order, under the direction of the controller 706. Each activated rotator 705 provides the corresponding set of P LLRs to the input of the corresponding I-O port 704 of one of the C CN sub-processors 1202 allocated to the processing of the row, via the interconnection network 1201. Note that, in accordance with some examples described herein and in parallel with this, other activated CN sub-processors 1202 can perform processing for sets of P PCM rows belonging to other rows of the basegraph in the set of concurrently processed orthogonal rows. With careful configuration, in accordance with some examples described herein, it can be ensured that each I-O port 704 of each activated CN sub-processor 1202 is never required to be connected via the interconnection network 1201 to more than one rotator 705 at a time. Also, it can be ensured that each rotator 705 is never required to be connected to more than one CN sub-processor 1202 at a time, as will be exemplified below for the 3GPP New Radio LDPC code.

Furthermore, in accordance with some examples described herein, if the row is an extension row (204 and 304) in the basegraph, then one of the allocated CN sub-processors 1202 is also provided with a set of P LLRs that are read from its corresponding extension VN memory 702 during the first set of sub-steps 1301. More specifically, these LLRs are provided by the particular sub-memory in the extension VN memory 702 that is mapped to the extension row (204 and 304). By contrast, the extension VN memories 702 allocated to the set of CN sub-processors 1202 are deactivated during all other circumstances in the first set of sub-steps 1301.

During the first set of sub-steps 1301 performed for the row, the activated subset of the connections to the inputs of the I-O ports 704 of the corresponding CN sub-processors 1202 are provided with sets of P LLRs. Note that in some cases, in accordance with some examples described herein, the subset may comprise one, some or all of the connections to the inputs of the I-O ports 704. As in the conventional LDPC decoder implementation 500, the CN sub-processors 1202 may operate using a variety of algorithms [3], including the sum-product, min-sum, normalised min-sum, offset min-sum or adjusted min-sum, for example. In the case of the min-sum algorithm, we may represent the input LLRs using the notation $a_{c,i,p}$ where c is in the range 1 to C and indicates which of the C CN sub-processors 1202 the LLR is being provided to, i is in the range 1 to A and indicates which of the A activated I-O ports 704 of the CN sub-processor 1202 the LLR is provided on and p is in the range 1 to P and indicates which of the P LLRs provided on that I-O port 704 this LLR is. In a first calculation, the CN sub-processors 1202 may perform a calculation $b_{c,i,p}=a_{c,i,p}-m_{c,i,p}$ corresponding to each input LLR $a_{c,i,p}$, where $m_{c,i,p}$ is a corresponding internally stored value which is initialised to 0 at the start of the LDPC decoding process and which is updated in each iteration of the processing of the P rows in the PCM. The CN sub-processors 1202 work together during the first set of sub-steps 1301 in order to identify the first and second minimum of the absolute values $|b_{c,i,p}|$ for each value of p and the corresponding values of the indices c and i are referred to as min1 and min2, respectively. Furthermore, the product of the signs $sign(b_{c,i,p})$ is identified for each value of p and referred to as $sign_p$.

During the second set of sub-steps 1302, in accordance with some examples described herein, the CN sub-processors 1202 may perform a calculation $m_{min1,min1,p}=sign(b_{c,i,p}) \times sign_p \times |b_{min2,min2,p}|$ corresponding to the input LLR $a_{c,i,p}$ having the indices c and i that correspond to min1 for each value of p. Meanwhile, a calculation $m_{c,i,p}=sign(b_{c,i,p}) \times sign_p \times |b_{min1,min1,p}|$ is performed corresponding to all other input LLRs for each value of p. Here, the value of $m_{c,i,p}$ is written into the internally stored value for each combination of c, i and p, so that it can be used during the next iteration of the processing of the P rows, as described above. Finally, the CN sub-processors 1202 may perform a calculation $d_{c,i,p}=b_{c,i,p}+m_{c,i,p}$, in order to obtain an output LLR $d_{c,i,p}$ for each of the P LLRs provided as outputs on each of the A activated I-O ports 704 of each of the C sub-processors 1202, in correspondence with the input LLR $a_{c,i,p}$.

Furthermore, during the second set of sub-steps 1302 in accordance with some examples described herein, each activated rotator 705 is provided with the corresponding set of P LLRs output by the corresponding I-O port 704 of one of the CN sub-processors 1202 allocated to the processing of the row, via the interconnection network 1201. Each of the activated rotators 705 is configured to rotate the set of P LLRs that it is provided with into an order that is appropriate for storage in the corresponding activated core VN memory 703. As in the enhanced and generalized LDPC decoder implementation, a ping-pong arrangement may be employed to avoid the requirement for rotations during one or other of the sets of sub-steps (1301 and 1302). Note that in parallel with this, other activated CN sub-processors 1202 can perform processing for sets of P PCM rows belonging to other rows of the basegraph in the set of concurrently processed orthogonal rows. With careful configuration, it can be ensured that each I-O port 704 of each activated CN sub-processor 1202 is never required to be connected via the interconnection network 1201 to more than one rotator 705 at a time. Also, it can be ensured that each rotator 705 is never required to be connected to more than one CN sub-processor 1202 at a time, as will be exemplified below for the 3GPP New Radio LDPC code.

Furthermore, during the second set of sub-steps 1302 and in accordance with some examples described herein, the CN processor 701 may also calculate syndrome bits corresponding to the P associated rows of the PCM. Additionally, if the row is an extension row (204 and 304) of the basegraph, the CN sub-processors 1202 may provide a set of P LLRs to the appropriate extension VN memory 702 during the second set of sub-steps 1302, which may be written to the sub-memory that is mapped to the extension row (204 and 304).

Note that, in accordance with some examples described herein, the processing of each sub-step 1303, 1304 within each operation of the LDPC decoding process may be spread over a number of consecutive clock cycles, each having different dedicated hardware in a practical implementation (such as illustrated in FIG. 12). Furthermore, the processing of successive sub-steps in the same set of sub-steps 1301, 1302 may be pipelined, such that the second clock cycle of a first sub-step 1303, 1304 is performed at the same time as the first clock cycle of a second sub-step 1303, 1304, for example. Likewise, the processing of successive operations in the same row of the basegraph may be pipelined, and the processing of successive orthogonal rows in the basegraph may be pipelined.

A Novel 3GPP New Radio LDPC Decoder Implementation Having Reduced Hardware Requirement and Reduced Number of Operations In an example embodiment for the 3GPP New Radio LDPC code, $n_{rot}=14$ rotators 705, $n_{rot}=14$ core VN memories 703, two extension VN memories 702 and a CN processor 701 comprising two CN sub-processors 1202 may be adopted, where each CN sub-processor 1202 has $n_{rot}/2+1=8$ I-O ports 704. Here, the core columns (201 and 301) of each basegraph are allocated to the core VN memories 703 using the same arrangement described for the novel 3GPP New Radio LDPC decoder implementation 700 having reduced hardware above. One of the I-O ports 704 in each CN sub-processor 1202 is connected to a corresponding one of the two extension VN memories 702.

More specifically, in accordance with some examples described herein, the extension VN memory 702 connected to the first CN sub-processor 1202 accommodates sub-memories that are mapped to the first row in each of groups C to O (1009 and 1109) of both basegraphs, while the extension VN memory 702 connected to the second CN sub-processor 1202 accommodates sub-memories that are mapped to the second row in each of groups C to O (1009 and 1109) of both basegraphs. Meanwhile, the sub-memories that are mapped to the rows in groups A and B (203, 1008, 303 and 1108) of both basegraphs can be accommodated in either extension VN memory 702. Each of the other $n_{rot}/2$ I-O ports 704 of each CN sub-processor 1202 is connected to a different pair of the rotators 705 via the interconnection network 1201, as listed in FIG. 14 for the first CN sub-processor 1202 and FIG. 15 for the second CN sub-processor 1202.

Figure 14:
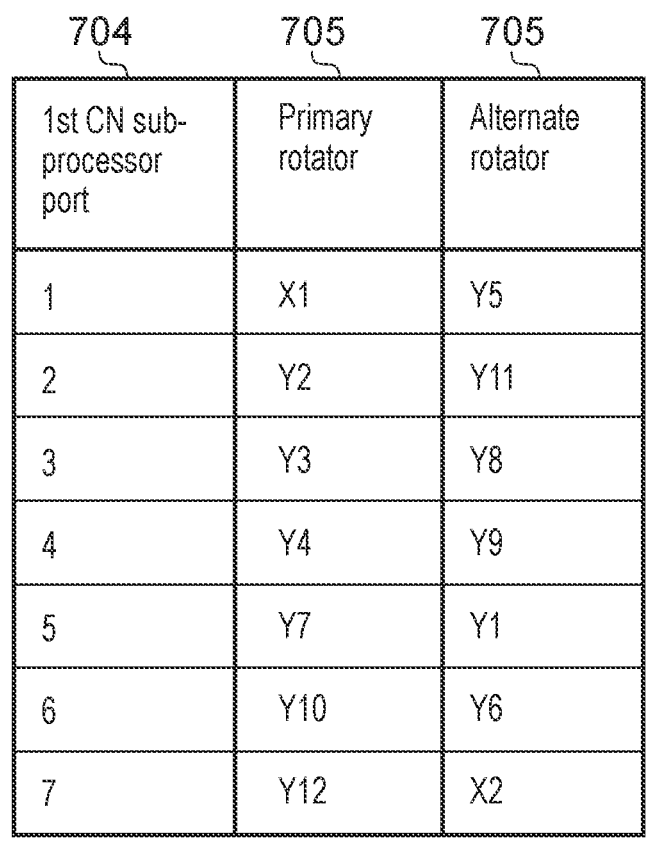
FIG. 14 illustrates a mapping between ports of a first Check Node (CN) sub-processor and rotators for an example embodiment of the LDPC decoder according to some examples of the invention having a reduced hardware requirement and reduced number of LDPC decoding operations, with application for the 3GPP New Radio LDPC code.
Figure 15:
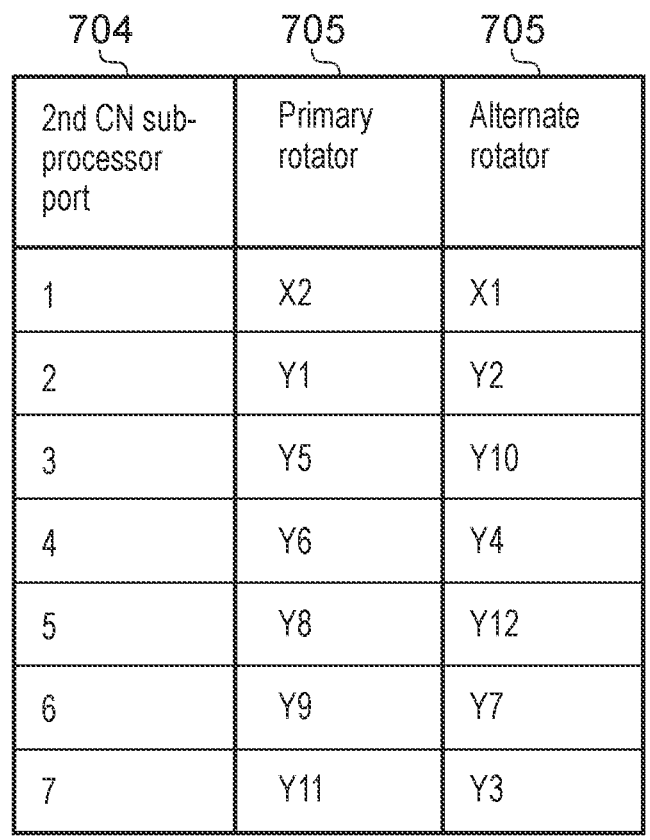
FIG. 15 illustrates a mapping between ports of a second CN sub-processor and rotators for an example embodiment of the LDPC decoder according to some examples of the invention having a reduced hardware requirement and reduced number of LDPC decoding operations, with application for the 3GPP New Radio LDPC code.

More specifically, in accordance with some examples described herein, FIGS. 14 and 15 illustrate a mapping between ports of the first and second Check Node (CN) sub-processor respectively and rotators for an example embodiment of the LDPC decoder according to some examples of the invention having a reduced hardware requirement and reduced number of LDPC decoding operations, with application for the 3GPP New Radio LDPC code. Here, the first two rotators 705 (allocated to the punctured core columns 707 and 707) are referred to as X1 and X2, while the remaining 12 rotators 705 are referred to as Y1 to Y12. As shown in FIG. 14 and FIG. 15, one of the rotators 705 connected via the interconnection network 1201 to each of these I-O ports 704 is referred to as its primary rotator 705, while the other rotator 705 connected to each of these I-O ports 704 is referred to as its alternate rotator 705. Note that the primary rotator of each I-O port is indicated using a filled dot in the interconnection network depicted in FIG. 12, while empty dots are used to indicate the corresponding alternate rotator.

During the processing of the rows in group A 203 of BG1 200 of FIG. 10 (namely the core rows 203 of BG1 200), each operation 1300 of the LDPC decoding process comprises a first 1301 and second 1302 set of sub-steps, which each comprise S=2 sub-steps (1303 and 1304), as described above for the novel LDPC decoding implementation 700 having a reduced hardware requirement. In this case, the two CN sub-processors 1202 operate together in order to complete the processing for P rows from the PCM in each operation 1300 of the LDPC decoding process. In this case, the I-O ports 704 of the CN sub-processors 1202 are connected to their primary rotators 705 via the interconnection network 1201.

During the processing of the rows in groups A or B (303 and 1108) of BG2 300 or group B 1008 of BG1 200, each operation 1300 of the LDPC decoding process comprises only a first sub-step 601 and a second sub-step 602, as described above for the novel LDPC decoding implementation 700 having a reduced hardware requirement. In this case, the two CN sub-processors 1202 operate together in order to complete the processing for P rows from the PCM in each operation 1300 of the LDPC decoding process. In this case, the I-O ports 704 of the CN sub-processors 1202 are connected to their primary rotators 705 via the interconnection network 1201.

During the processing of the rows in groups C to O (1009 and 1109) of BG1 200 or BG2 300, each operation 1300 of the LDPC decoding process comprises only a first sub-step 601 and a second sub-step 602. However, during these sub-steps, P PCM rows from both rows in the group are processed concurrently. The P PCM rows from the first row in the group (e.g. C1 or D1) are processed by the first CN sub-processor 1202 and the P PCM rows from the second row in the group (e.g. C2 or D2) are processed by the second CN sub-processor 1202. In this case, the I-O ports 704 of the CN sub-processors 1202 are connected via the interconnection network 1201 to whichever of their two rotators 705 is activated in the current operation 1300, owing to the presence of a binary value of 1 in a corresponding core column (201 and 301) in the corresponding row of the basegraph. If neither of the rotators 705 connected to an I-O port 704 is activated, then that port 704 is deactivated. Note that owing to the careful arrangement of the interconnection network 1201 detailed in FIGS. 14 and 15, the situation where both rotators 705 connected to any one CN sub-processor I-O port 704 are both activated at the same time will never occur.

Application

Figure 16:
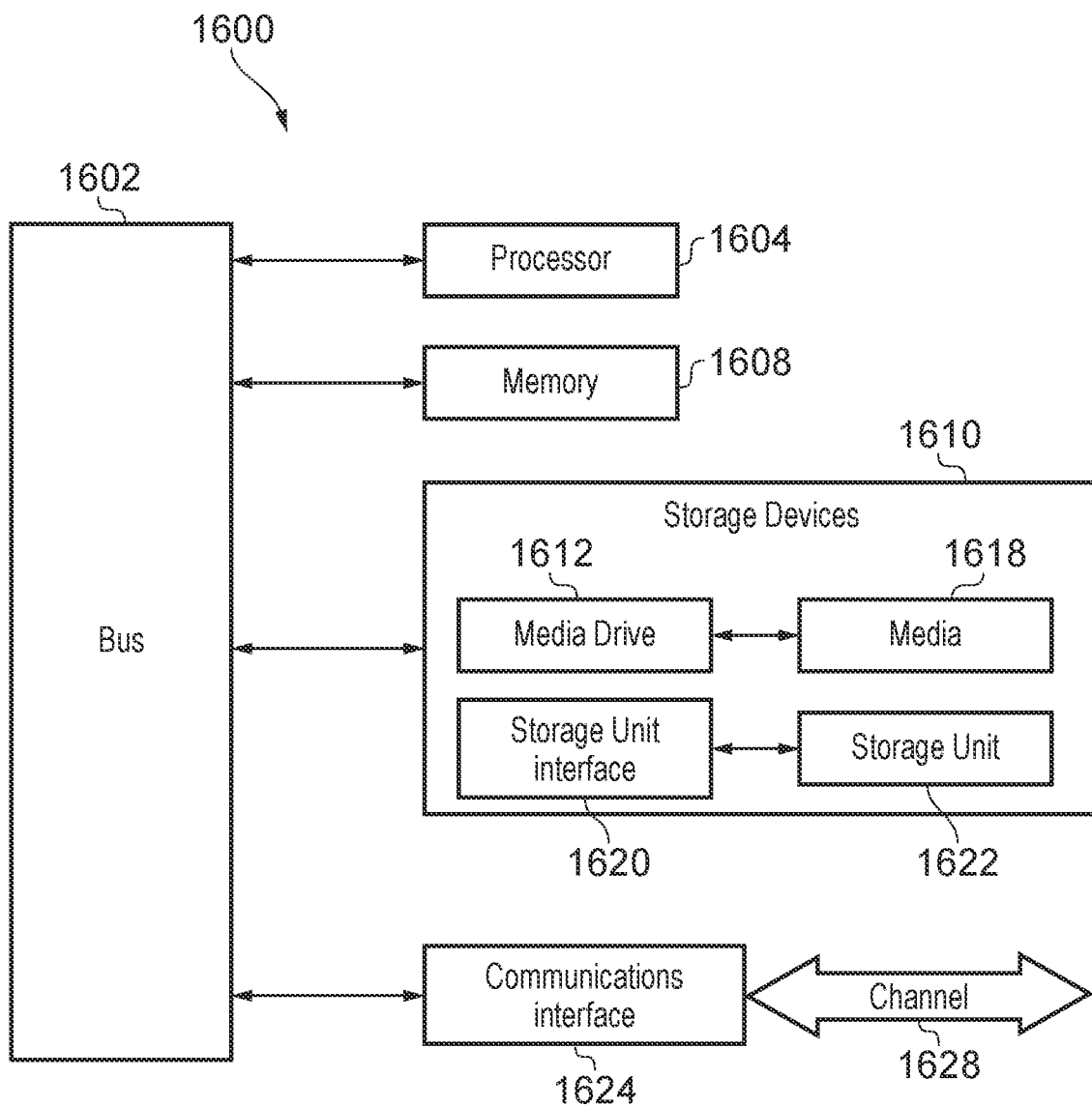
FIG. 16 illustrates a typical computing system that may be employed in an electronic device such as a wireless communication unit to perform LDPC decoding in accordance with some example embodiments of the invention.

Referring now to FIG. 16, there is illustrated a typical computing system 1600 that may be employed to implement LDPC computation according to some example embodiments of the invention. Computing systems of this type may be used in electronic devices. Those skilled in the relevant art will also recognize how to implement the invention using other computer systems or architectures. Computing system 1600 may represent, for example, a desktop, laptop or notebook computer, hand-held computing device (PDA, cell phone, palmtop, etc.), mainframe, server, client, or any other type of special or general purpose computing device as may be desirable or appropriate for a given application or environment. Computing system 1600 can include at least one processors, such as a processor 1604. Processor 1604 can be implemented using a general or special-purpose processing engine such as, for example, a microprocessor, microcontroller or other control logic. In this example, processor 1604 is connected to a bus 1602 or other communications medium. In some examples, computing system 1600 may be a non-transitory tangible computer program product comprising executable code stored therein for implementing LDPC computation.

Computing system 1600 can also include a main memory 1608, such as random access memory (RAM) or other dynamic memory, for storing information and instructions to be executed by processor 1604. Main memory 1608 also may be used for storing temporary variables or other intermediate information during execution of instructions to be executed by processor 1604. Computing system 1600 may likewise include a read only memory (ROM) or other static storage device coupled to bus 1602 for storing static information and instructions for processor 1604.

The computing system 1600 may also include information storage system 1610, which may include, for example, a media drive 1612 and a removable storage interface 1620. The media drive 1612 may include a drive or other mechanism to support fixed or removable storage media, such as a hard disk drive, a floppy disk drive, a magnetic tape drive, an optical disk drive, a compact disc (CD) or digital video drive (DVD) read or write drive (R or RW), or other removable or fixed media drive. Storage media 1618 may include, for example, a hard disk, floppy disk, magnetic tape, optical disk, CD or DVD, or other fixed or removable medium that is read by and written to by media drive 1612. As these examples illustrate, the storage media 1618 may include a computer-readable storage medium having particular computer software or data stored therein.

In alternative embodiments, information storage system 1610 may include other similar components for allowing computer programs or other instructions or data to be loaded into computing system 1600. Such components may include, for example, a removable storage unit 1622 and an interface 1620, such as a program cartridge and cartridge interface, a removable memory (for example, a flash memory or other removable memory module) and memory slot, and other removable storage units 1622 and interfaces 1620 that allow software and data to be transferred from the removable storage unit 1618 to computing system 1600.

Computing system 1600 can also include a communications interface 1624. Communications interface 1624 can be used to allow software and data to be transferred between computing system 1600 and external devices. Examples of communications interface 1624 can include a modem, a network interface (such as an Ethernet or other NIC card), a communications port (such as for example, a universal serial bus (USB) port), a PCMCIA slot and card, etc. Software and data transferred via communications interface 1624 are in the form of signals which can be electronic, electromagnetic, and optical or other signals capable of being received by communications interface 1624. These signals are provided to communications interface 1624 via a channel 1628. This channel 1628 may carry signals and may be implemented using a wireless medium, wire or cable, fibre optics, or other communications medium. Some examples of a channel include a phone line, a cellular phone link, an RF link, a network interface, a local or wide area network, and other communications channels.

In this document, the terms 'computer program product', 'computer-readable medium' and the like may be used generally to refer to media such as, for example, memory 1608, storage device 1618, or storage unit 1622. These and other forms of computer-readable media may store at least one instruction for use by processor 1604, to cause the processor to perform specified operations. Such instructions, generally referred to as 'computer program code' (which may be grouped in the form of computer programs or other groupings), when executed, enable the computing system 1600 to perform functions of embodiments of the present invention. Note that the code may directly cause the processor to perform specified operations, be compiled to do so, and/or be combined with other software, hardware, and/or firmware elements (e.g., libraries for performing standard functions) to do so.

In an embodiment where the elements are implemented using software, the software may be stored in a computer-readable medium and loaded into computing system 1600 using, for example, removable storage drive 1622, drive 1612 or communications interface 1624. The control logic (in this example, software instructions or computer program code), when executed by the processor 1604, causes the processor 1604 to perform the functions of the invention as described herein.

In the foregoing specification, the invention has been described with reference to specific examples of embodiments of the invention. It will, however, be evident that various modifications and changes may be made therein without departing from the scope of the invention as set forth in the appended claims and that the claims are not limited to the specific examples described above.

The connections as discussed herein may be any type of connection suitable to transfer signals from or to the respective nodes, units or devices, for example via intermediate devices. Accordingly, unless implied or stated otherwise, the connections may for example be direct connections or indirect connections. The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections and vice versa. Also, plurality of connections may be replaced with a single connection that transfers multiple signals serially or in a time multiplexed manner. Likewise, single connections carrying multiple signals may be separated out into various different connections carrying subsets of these signals. Therefore, many options exist for transferring signals.

Those skilled in the art will recognize that the architectures depicted herein are merely exemplary, and that in fact many other architectures can be implemented which achieve the same functionality.

Any arrangement of components to achieve the same functionality is effectively 'associated' such that the desired functionality is achieved. Hence, any two components herein combined to achieve a particular functionality can be seen as 'associated with' each other such that the desired functionality is achieved, irrespective of architectures or intermediary components. Likewise, any two components so associated can also be viewed as being 'operably connected,' or 'operably coupled,' to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

The present invention is herein described with reference to an integrated circuit device comprising, say, a microprocessor configured to perform the functionality of a LDPC computation. However, it will be appreciated that the present invention is not limited to such integrated circuit devices, and may equally be applied to integrated circuit devices comprising any alternative type of operational functionality. Examples of such integrated circuit device comprising alternative types of operational functionality may include, by way of example only, application-specific integrated circuit (ASIC) devices, field-programmable gate array (FPGA) devices, or integrated with other components, etc. Furthermore, because the illustrated embodiments of the present invention may for the most part, be implemented using electronic components and circuits known to those skilled in the art, details have not been explained in any greater extent than that considered necessary, for the understanding and appreciation of the underlying concepts of the present invention and in order not to obfuscate or distract from the teachings of the present invention. Alternatively, the circuit and/or component examples may be implemented as any number of separate integrated circuits or separate devices interconnected with each other in a suitable manner.

Also for example, the examples, or portions thereof, may implemented as soft or code representations of physical circuitry or of logical representations convertible into physical circuitry, such as in a hardware description language of any appropriate type. Also, the invention is not limited to physical devices or units implemented in non-programmable hardware but can also be applied in programmable devices or units able to perform the desired LDPC computation by operating in accordance with suitable program code, such as minicomputers, personal computers, notepads, personal digital assistants, electronic games, automotive and other embedded systems, cell phones and various other wireless devices, commonly denoted in this application as 'computer systems'.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms 'a' or 'an,' as used herein, are defined as at least one than one. Also, the use of introductory phrases such as 'at least one' and 'at least one' in the claims should not be construed to imply that the introduction of another claim element by the indefinite articles 'a' or 'an' limits any particular claim containing such introduced claim element to inventions containing only one such element, even when the same claim includes the introductory phrases 'at least one' or 'at least one' and indefinite articles such as 'a' or 'an.' The same holds true for the use of definite articles. Unless stated otherwise, terms such as 'first' and 'second' are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage. The word 'subset' refers to a selection of elements from a set, where that selection may comprise one, some or all of the elements in the set.

REFERENCES

[1] "3rd Generation Partnership Project; Technical Specification Group Radio Access Network; NR; Multiplexing and channel coding (Release 15)", 3GPP TS 38.212 V15.2.0, June 2018.

[2] K. Shimizu, T. Ishikawa, N. Togawa, T. Ikenaga, and S. Goto, "Partially-parallel LDPC decoder based on high-efficiency message-passing algorithm," in *Proc. Int. Conf. Comput. Design*, October 2005, pp. 503-510.

[3] X. Wu, Y. Song, M. Jiang and C. Zhao, "Adaptive-Normalized/Offset Min-Sum Algorithm," in *IEEE Communications Letters*, vol. 14, no. 7, pp. 667-669, July 2010.

We claim:

1. An electronic device comprises:
    a check node, CN, processor having a plurality of input-output, I-O, ports and configured to receive soft bits associated with one or more rows within a same blockrow of a parity check matrix, PCM, derived from at least one basegraph, and perform a series of low density parity check, LDPC, decoding operations that use the at least one basegraph that comprises two or more columns, each column associated with a set of two or more soft bit values;
    two or more rotators, each rotator configured to rotate an order of a subset of two or more soft bit values of the set of two or more soft bit values of a column when activated in an LDPC decoding operation that comprises at least two sub-steps grouped into each of a first set and a second set; and
    a controller operably coupled to the two or more rotators and configured to independently control an activation and a rotation of a subset of each of the two or more rotators based on a current LDPC decoding operation and the at least one basegraph;
    wherein rotations associated with each column in each of the at least one basegraph are performed by a particular one of the rotators of the two or more rotators, wherein each rotator performs rotations for a set of one or more columns, with at least one of the rotators performing rotations for two or more columns in a same basegraph,
    wherein the controller is configured to activate rotators corresponding to a subset of the two or more columns that has a binary value of '1' in a row of the at least one basegraph; and
    wherein each LDPC decoding operation comprises processing rows in which a number of binary values of '1' in core columns of a first basegraph of the at least one basegraph exceeds a number of rotators used, $n_{rot}$, using a first set of two or more sub-steps and a second set of two or more sub-steps.

2. The electronic device of claim 1, wherein the series of LDPC decoding operations comprise sub-steps for a parity check matrix, PCM, of the at least one basegraph:
    wherein the controller is configured to activate a subset of the plurality of I-O ports in each LDPC decoding operation, wherein the CN processor is configured to perform LDPC decoding computations for two or more rows of the PCM derived from a single row in the at least one basegraph;
    and wherein each rotator is operably coupled to a corresponding I-O port of the CN processor and wherein a corresponding rotated subset of two or more soft bit values are passed between each activated rotator and its corresponding I-O port of the CN processor in each LDPC decoding sub-step.

3. The electronic device of claim 1, further comprising:
    two or more variable node, VN, memories, each VN memory configured to store sets of two or more soft bit values of the two or more columns, wherein the two or more VN memories are operably coupled to the controller that is configured to activate a read operation from and a write operation to a subset of the two or more VN memories in the current LDPC decoding operation;
    and wherein each rotator and the set of columns for which it performs rotations is operably coupled to a corresponding VN memory of the two or more VN memories and wherein the subset of two or more soft bit values are passed between each activated rotator and its corresponding VN memory in each LDPC decoding operation.

4. The electronic device of claim 3, wherein in each sub-step of the first set of sub-steps of LDPC decoding operations, the VN memory corresponding to each activated rotator is configured to provide the corresponding activated rotator with two or more soft bit values, which are read from a location in the VN memory corresponding to a column having a binary value of '1' in the row of the at least one basegraph.

5. The electronic device of claim 4, wherein, in each sub-step of the second set of sub-steps in the LDPC decoding operations,
    the CN processor is configured to provide a corresponding subset of two or more updated soft bit values to each activated rotator using the corresponding I-O port; and
    each activated rotator provides its corresponding VN memory with the two or more updated soft bit values, which are written to a location in the VN memory corresponding to a column having a binary value of '1' in the row of the at least one basegraph.

6. The electronic device of claim 4, wherein the CN processor is configured to determine two or more minimum values and two or more next minimum values from the two or more soft bit values provided as inputs on each of its I-O ports in each of the sub-steps during the first set of sub-steps of the LDPC decoding operations and wherein the CN processor is configured to use the two or more minimum values and two or more next minimum values to determine the two or more soft bit values provided as outputs on each of its I-O ports in each of the second sub-steps during the second set of sub-steps of the LDPC decoding operations.

7. The electronic device of claim 4, wherein the CN processor is configured to perform, during the second set of sub-steps of the LDPC decoding operations, at least one of:
provide two or more soft bit values to an extension VN memory using one of its I-O ports when the row in the at least one basegraph is an extension row;
calculate a set of two or more syndrome bits.

8. The electronic device of claim 3, wherein the CN processor is configured to perform at least one of:
processing of each sub-step spread over one or more clock cycles;
processing of successive sub-steps in a same pipelined set;
processing of the first set and the second set in a same pipelined set of LDPC decoding operations;
processing of successive pipelined LDPC decoding operations in a same row of the at least one basegraph;
processing of successive orthogonal pipelined rows in the at least one basegraph.

9. The electronic device of claim 1, wherein during the first set of the LDPC decoding operations, an extension VN memory is configured to provide two or more soft bit values to an I-O port of the CN processor when the row in the at least one basegraph is an extension row.

10. The electronic device of claim 1, wherein rows of the at least one basegraph having the number of core columns that is either:
no greater than a number of rotators are processed using the first set comprising one first sub-step and the second set comprising one second sub-step; or
greater than a number of rotators but having the number of binary values of '1' in the core columns that is no greater than a number of rotators are processed using the first set comprising one first sub-step and the second set comprising one sub-step.

11. The electronic device of claim 1, wherein extension rows of the first basegraph are processed using one first sub-step in the first set and one second sub-step in the second set, and all rows of a second basegraph are processed using one first sub-step in the first set and one second sub-step in the second set.

12. The electronic device of claim 1, wherein the at least one basegraph has a plurality of rows, the electronic device further comprising:
a check node, CN, processor comprising two or more CN sub-processors, each CN sub-processor having one or more input-output, I-O, ports;
wherein the controller is operably coupled to the CN processor and configured to activate a subset of the one or more I-O ports based on a current LDPC decoding sub-step of the LDPC decoding operations and the at least one basegraph; and
wherein the CN processor is configured to support at least two modes of operation:
a first mode of operation whereby each CN sub-processor is configured in a single LDPC decoding operation to perform LDPC decoding computations for two or more rows of the PCM that are derived from different orthogonal rows of the plurality of rows in the at least one basegraph;
a second mode of operation whereby two or more of the CN sub-processors are configured in a single LDPC decoding operation to co-operate to perform LDPC decoding computations for two or more rows of the PCM that are derived from a single row in the at least one basegraph.

13. The electronic device of claim 12, wherein, in the first mode of operation, the controller is configured to allocate each row in each set of orthogonal rows in the at least one basegraph to a respective CN sub-processor.

14. The electronic device of claim 12, wherein the controller is configured to rotate an order of two or more soft bit values when activated in an LDPC decoding sub-step; the electronic device further comprising
an interconnection network, operably coupled to the controller and the CN processor and configured to support a connection of I-O ports of the CN sub-processors to incomplete subsets of the two or more rotators;
wherein rotations of two or more soft bit values associated with each column in each basegraph are performed by a particular one of the two or more rotators and wherein the controller configures the interconnection network to pass the two or more soft bit values between each activated rotator and a corresponding I-O port of a CN sub-processor in each LDPC decoding sub-step.

15. The electronic device of claim 12, further comprising:
two or more variable node, VN, memories, each VN memory configured to store two or more soft bit values, wherein the two or more VN memories are operably coupled to the controller that is configured to activate a read operation from and a write operation to a subset of the two or more VN memories in the current LDPC decoding sub-step;
and wherein each rotator and a corresponding set of columns is operably coupled to a corresponding VN memory of the two or more VN memories and wherein two or more soft bit values are passed between each activated rotator and its corresponding VN memory in each LDPC decoding sub-step.

16. The electronic device of claim 15, wherein, in each sub-step of the first set of sub-steps of the LDPC decoding operations, the VN memory corresponding to each activated rotator is configured to provide the corresponding activated rotator with two or more soft bit values, which are read from a location in the VN memory corresponding to a column having the binary value of '1' in the rows of the selected at least one basegraph.

17. The electronic device of claim 15, wherein each activated CN sub-processor is configured to determine two or more minimum values and two or more next minimum values from the two or more soft bit values provided as inputs on each of its I-O ports in each of the sub-steps during the first set of sub-steps of the LDPC decoding operations and wherein the CN processor supports at least the following two modes of operation:
in the first mode of operation, each activated CN sub-processor is configured to use its two or more minimum values and two or more next minimum values to determine the two or more soft bit values to output on an I-O port in each of the sub-steps during the second set;
in the second mode of operation, each activated CN sub-processor is configured to use its two or more minimum values and two or more next minimum values and two or more minimum values and two or more next minimum values provided by at least one other activated CN sub-processor to determine the two or more soft bit values to output on each of I-O port in each of the sub-steps during the second set.

18. The electronic device of claim 12, wherein the CN processor is configured to perform at least one of:
- processing of each sub-step spread over one or more clock cycles;
- processing of successive sub-steps in a same pipelined set of sub-steps;
- processing of the first set and the second set in a same pipelined set of LDPC decoding operations;
- processing of successive pipelined set of LDPC decoding operations in a same row of the at least one basegraph.

19. A method for low density parity check, LDPC, decoding in an electronic device, the method comprising:
- receiving soft bits associated with one or more rows within a same blockrow of a parity check matrix, PCM, derived from at least one basegraph;
- performing a series of low density parity check, LDPC, decoding operations that comprises at least two sub-steps grouped into each of a first set and a second set and that use the at least one basegraph that comprises two or more columns, each column associated with a set of two or more soft bit values;
- independently controlling, by a controller, an activation rotator corresponding to a rotation of a subset of the two or more columns that has a binary value of '1' in a row of the at least one basegraph based on a current LDPC decoding operation;
- rotating an order of a subset of two or more soft bit values of the set of two or more soft bit values of a column when activated in an LDPC decoding operation,
- wherein rotations associated with each column in each basegraph are performed by a particular one of the rotators of the two or more rotators, wherein each rotator performs rotations for a set of one or more columns, with at least one of the rotators performing rotations for two or more columns in a same basegraph and
- wherein each LDPC decoding operation comprises processing rows in which the number of binary values of '1' in core columns of the first basegraph of the at least one basegraph exceeds a number of rotators used, $n_{rot}$, are processed using the at least two sub-steps in the first set and using the at least two sub-steps in the second set.

20. The method for LDPC according to claim 19, the method further comprising:
- deriving a parity check matrix, PCM, from at least one basegraph having a plurality of rows;
- performing a series of low density parity check, LDPC, decoding operations for the PCM;
- activating a subset of one or more input/output, I-O, ports of the two or more CN sub-processors based on a current LDPC decoding sub-step of the LDPC decoding operations and the at least one basegraph;
- configuring the two or more CN sub-processors in a first mode of operation in a single LDPC decoding operation to perform LDPC decoding computations for two or more rows of the PCM that are derived from different orthogonal rows of the plurality of rows in the at least one basegraph; and
- configuring the two or more CN sub-processors in a second mode of operation in a single LDPC decoding operation to co-operate to perform LDPC decoding computations for two or more rows of the PCM that are derived from a single row in the at least one basegraph.

* * * * *